(12) United States Patent
Kim et al.

(10) Patent No.: US 8,361,905 B2
(45) Date of Patent: *Jan. 29, 2013

(54) METHODS OF FORMING PATTERNS FOR SEMICONDUCTOR DEVICES

(75) Inventors: Bong-cheol Kim, Seoul (KR); Dae-youp Lee, Gyeonggi-do (KR); Hyun-woo Kim, Gyeonggi-do (KR); Young-moon Choi, Seoul (KR); Jong-su Park, Incheon (KR); Byeong-hwan Son, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 595 days.

This patent is subject to a terminal disclaimer.

(21) Appl. No.: 12/581,298

(22) Filed: Oct. 19, 2009

(65) Prior Publication Data
US 2010/0240221 A1  Sep. 23, 2010

(30) Foreign Application Priority Data

Mar. 19, 2009  (KR) ......................... 10-2009-0023544

(51) Int. Cl.
*H01L 21/302* (2006.01)
*H01L 21/461* (2006.01)
*H01L 21/311* (2006.01)

(52) U.S. Cl. ........................................ 438/717; 438/696
(58) Field of Classification Search ................... 438/717
See application file for complete search history.

(56) References Cited

U.S. PATENT DOCUMENTS

| 7,115,525 | B2 | 10/2006 | Abatchev et al. | |
| 8,110,506 | B2 * | 2/2012 | Min et al. | 438/736 |
| 2005/0064719 | A1 * | 3/2005 | Liu et al. | 438/725 |

FOREIGN PATENT DOCUMENTS

| JP | 2007-305970 | 11/2007 |
| KR | 1020080029719 A | 4/2008 |

\* cited by examiner

*Primary Examiner* — Binh X Tran
*Assistant Examiner* — Thomas Pham
(74) *Attorney, Agent, or Firm* — Myers Bigel Sibley & Sajovec

(57) ABSTRACT

Provided are methods of forming patterns of semiconductor devices, whereby patterns having various widths may be simultaneously formed, and a pattern density may be doubled by a double patterning process in a portion of the semiconductor device. A dual mask layer is formed on a substrate. A variable mask layer is formed on the dual mask layer. A first photoresist pattern having a first thickness and a first width in the first region, and a second photoresist pattern having a second thickness greater than the first thickness and a second width wider than the first width in the second region are formed on the variable mask layer. A first mask pattern and a first variable mask pattern are formed in the first region, and a second mask pattern and a second variable mask pattern are formed in the second region, by sequentially etching the variable mask layer and the dual mask layer by using, as etch masks, the first photoresist pattern and the second photoresist pattern. First spacers covering side walls of the first mask pattern and second spacers covering side walls of the second mask pattern are formed. The first mask pattern is removed, and then the substrate is etched in the first region and the second region by using the first spacers as an etch mask in the first region, and the second mask pattern and the second spacers as an etch mask in the second region.

10 Claims, 23 Drawing Sheets

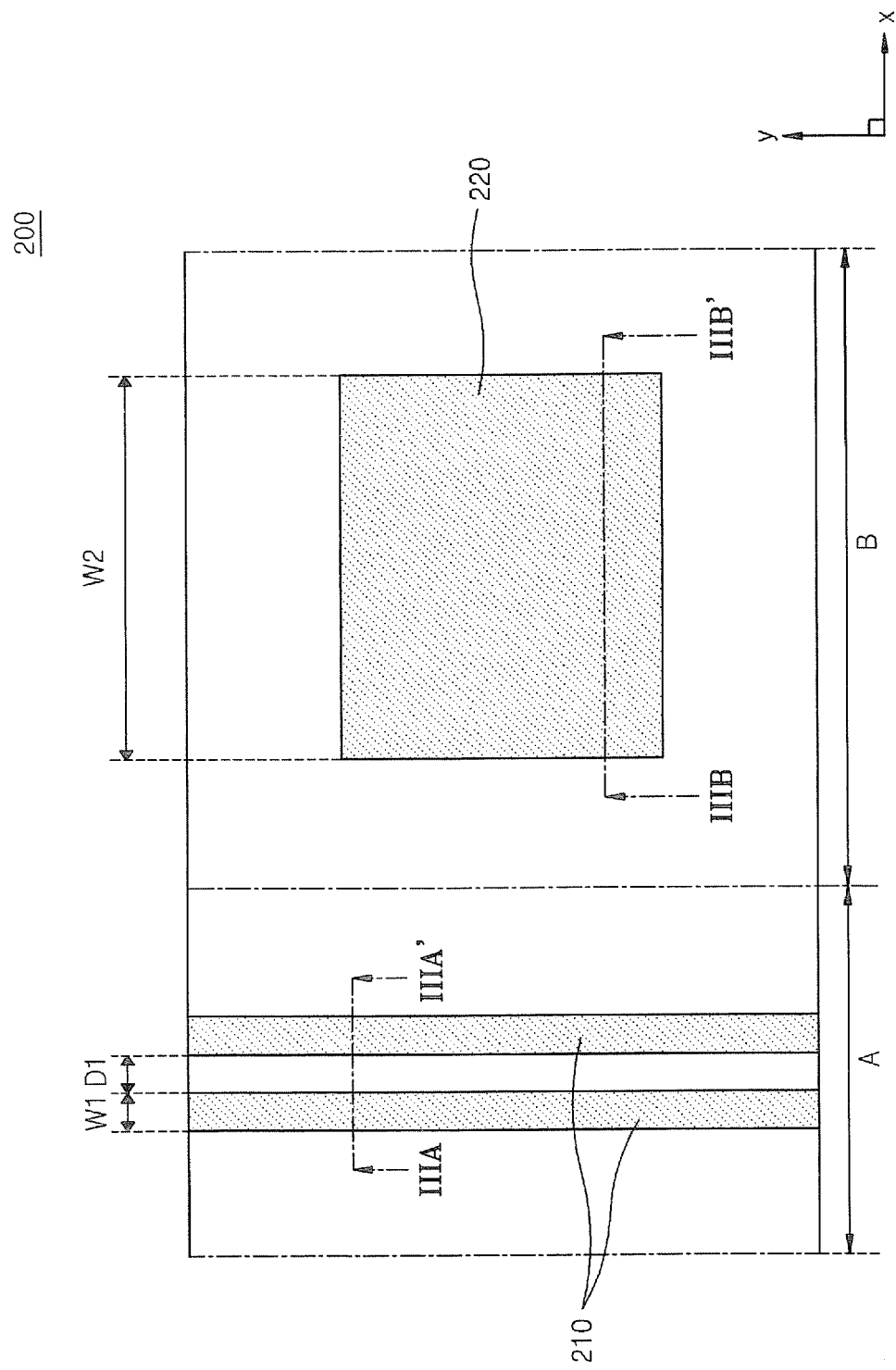

HA < HB

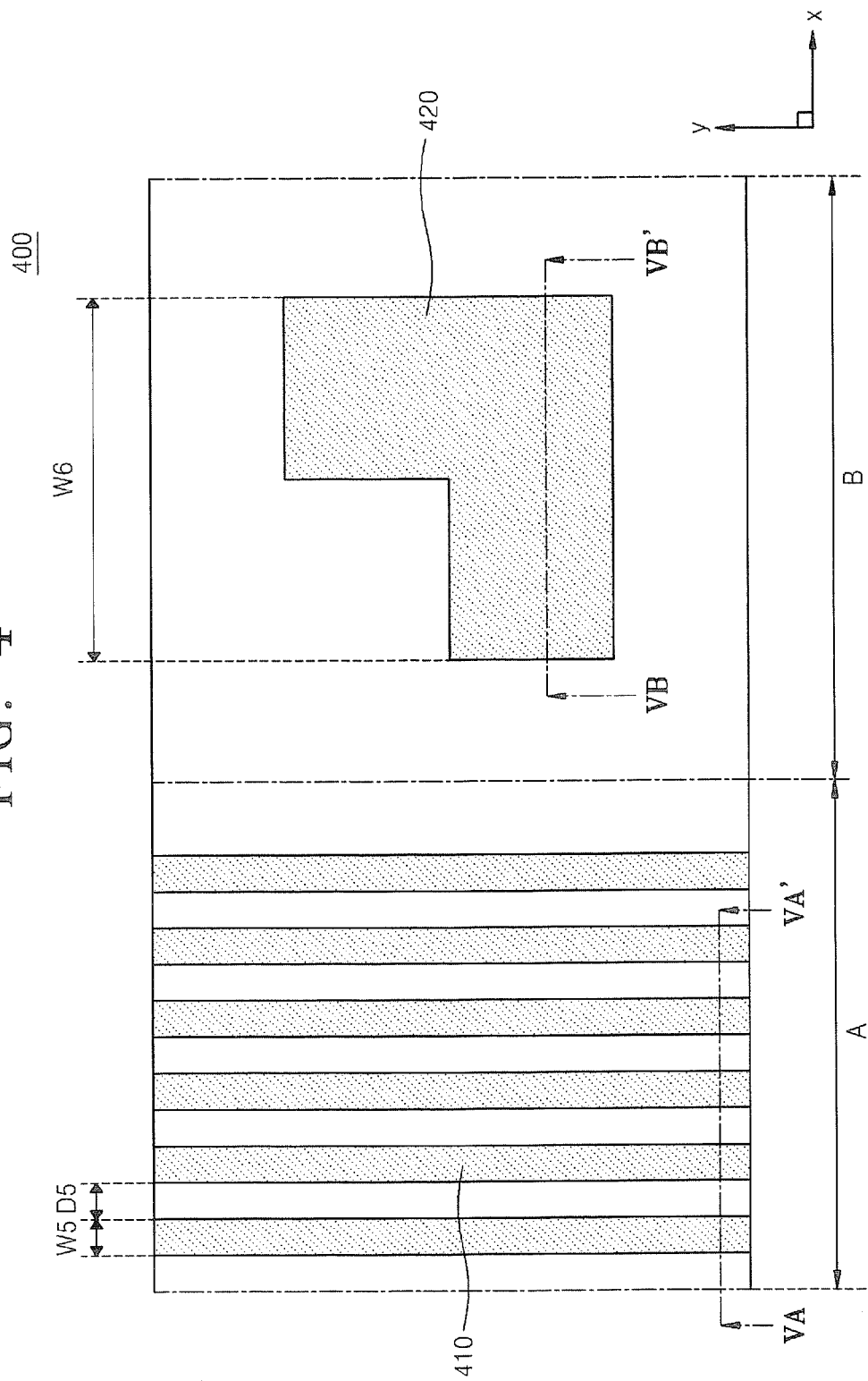

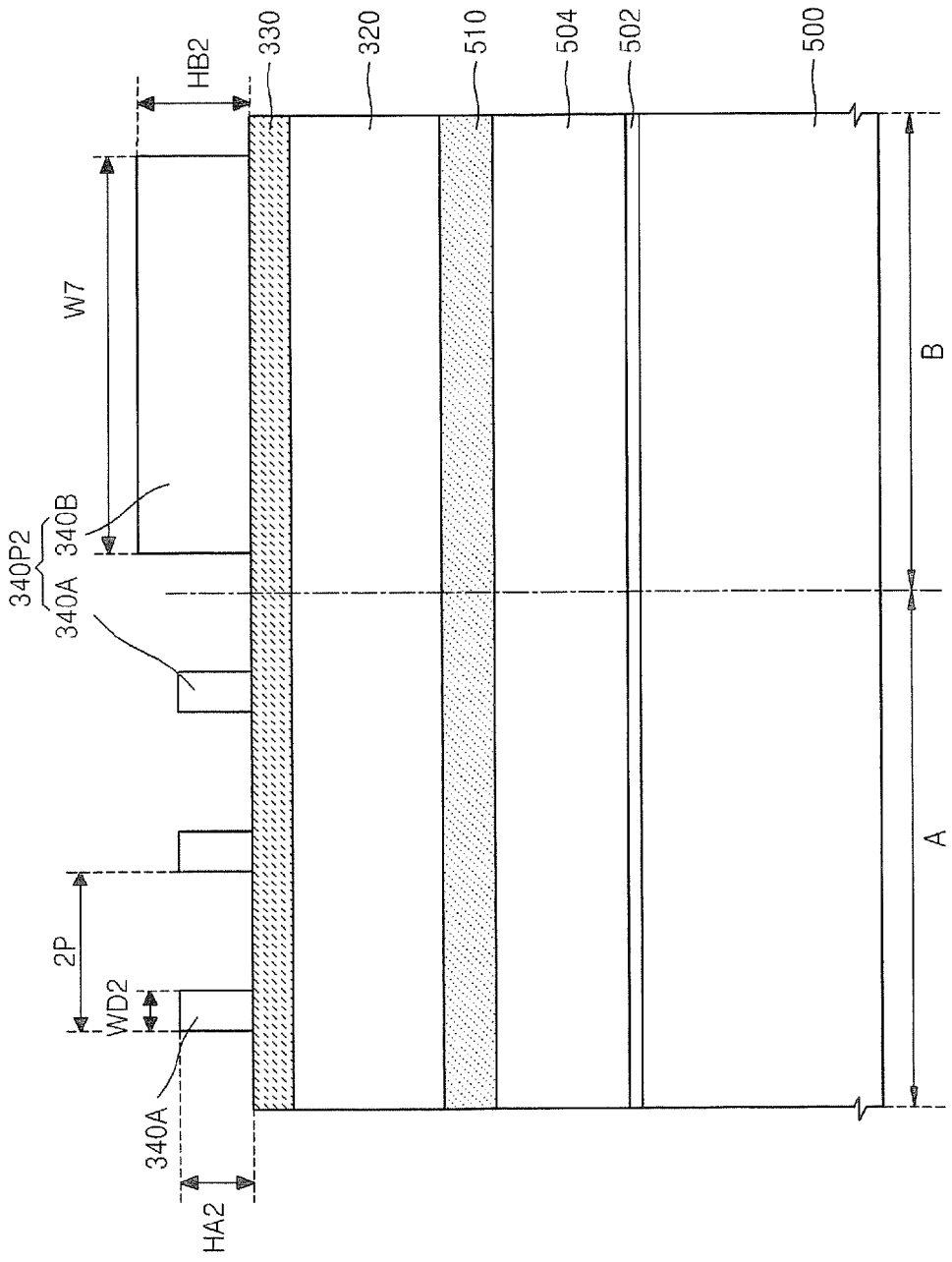

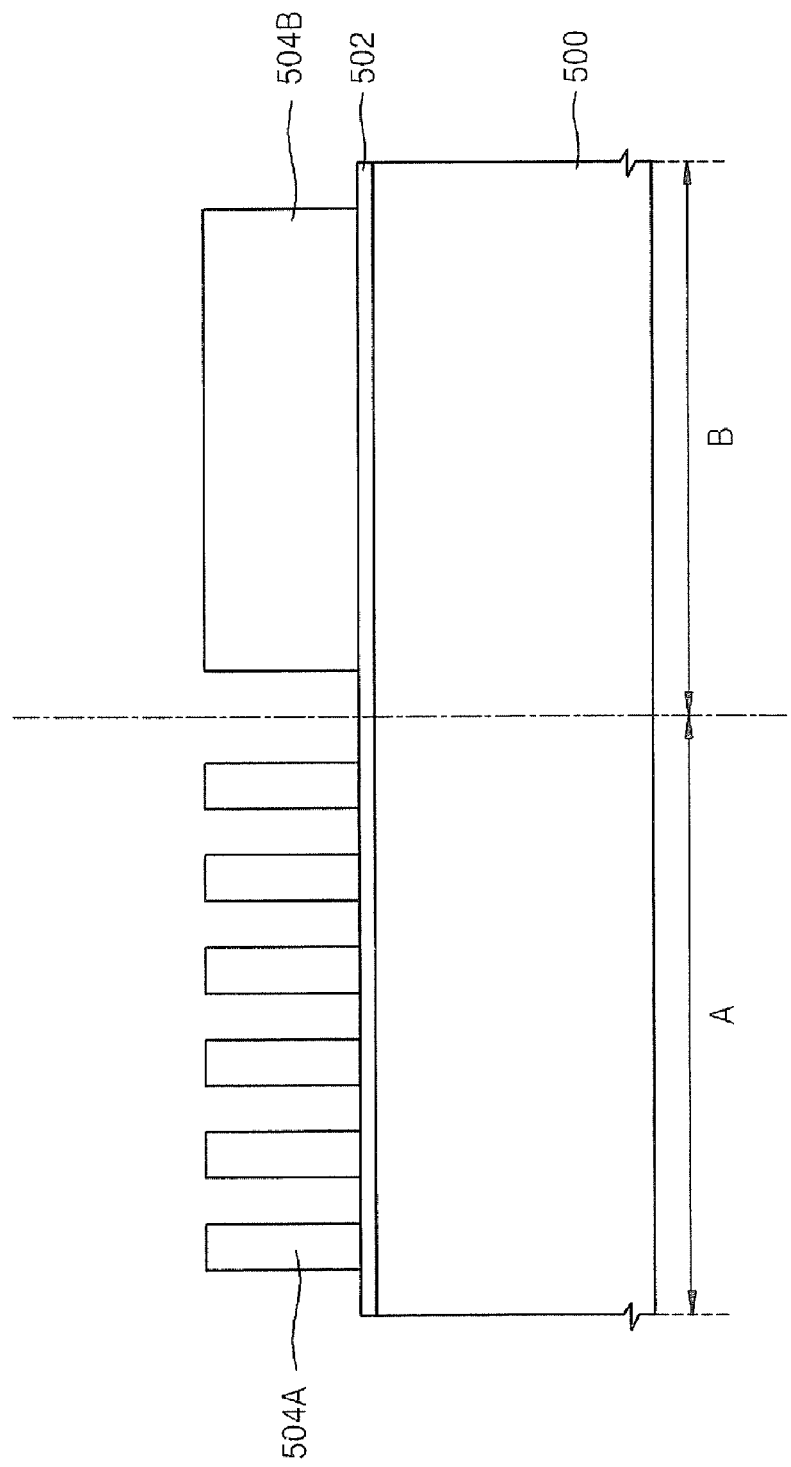

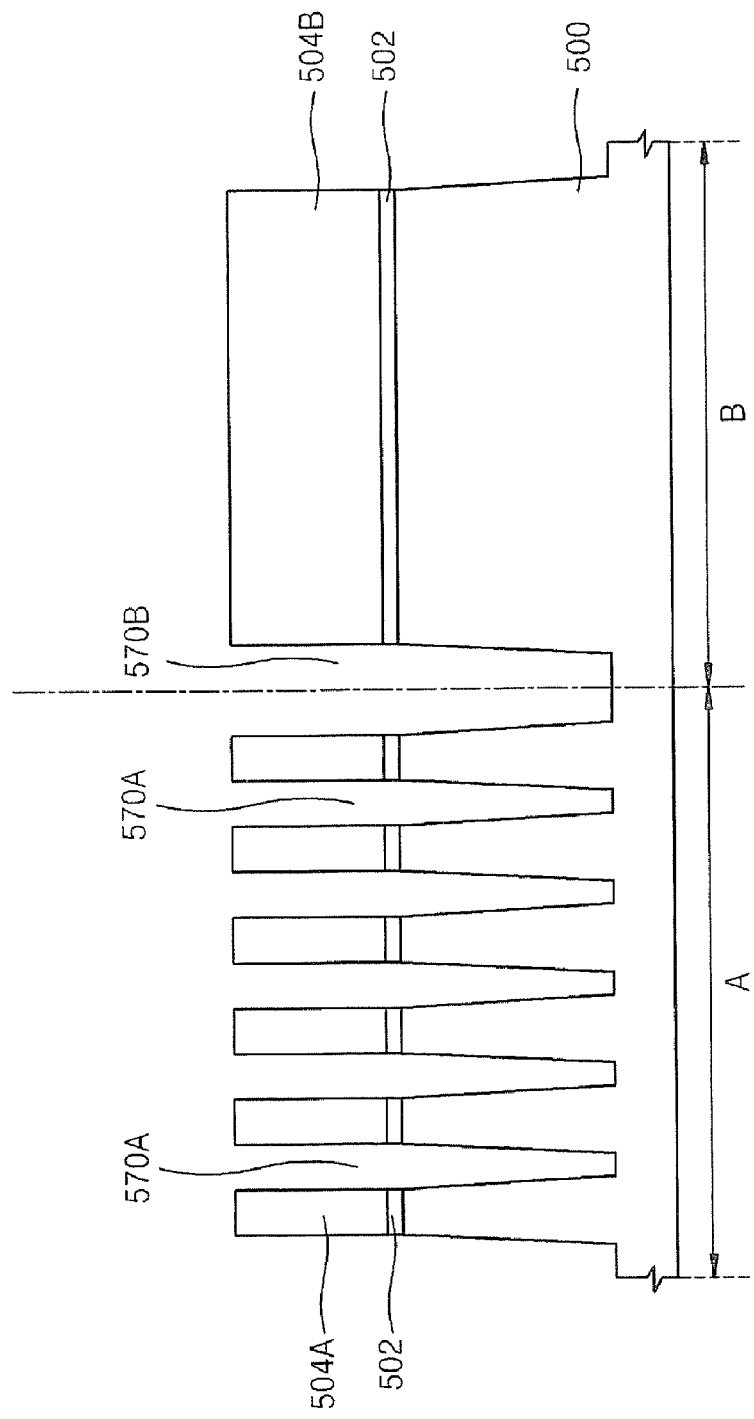

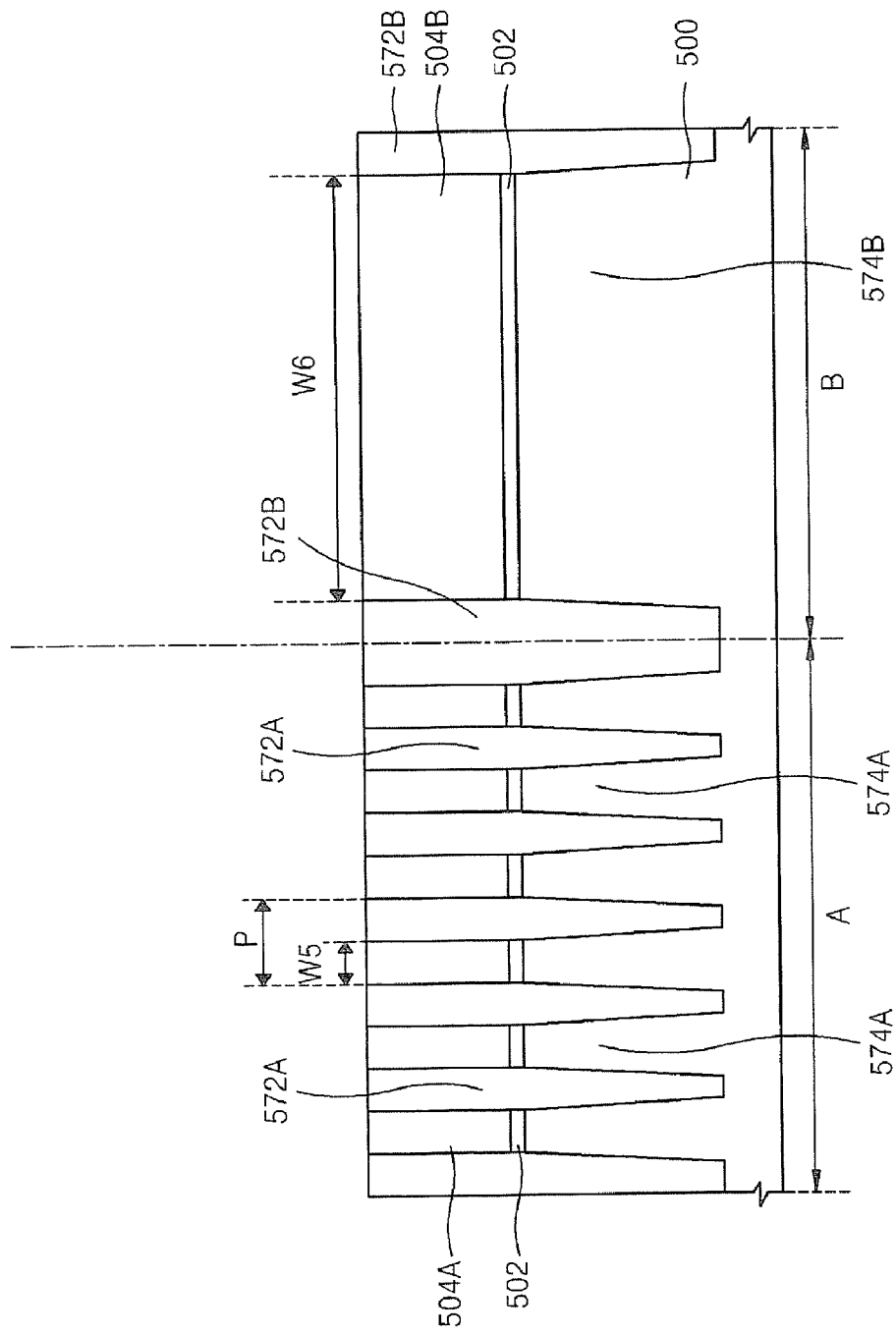

METHODS OF FORMING PATTERNS FOR SEMICONDUCTOR DEVICES

CROSS-REFERENCE TO RELATED APPLICATIONS

This application claims the benefit of Korean Patent Application No. 10-2009-0023544, filed on Mar. 19, 2009, in the Korean Intellectual Property Office, the disclosure of which is incorporated herein in its entirety by reference as if set forth fully herein.

BACKGROUND

The inventive disclosed herein relates to semiconductor devices, and more particularly to methods of forming patterns for semiconductor devices.

Fabricating highly integrated nanoscale semiconductor devices may be performed by forming various patterns. For example, photolithography processes may be used to form such patterns. However, conventional photolithography techniques may be limited to an undesirable resolution limit.

SUMMARY

Some embodiments of the present invention provides methods of forming patterns of semiconductor devices such that the patterns have various widths without performing a separate photolithography process due to a difference in width between the patterns when the patterns having various widths are simultaneously formed.

According to some embodiments, methods of forming patterns of semiconductor devices are provided. Such methods may provide that a dual mask layer may be formed on a substrate having a first region and a second region. A variable mask layer may be formed on the dual mask layer in the first region and the second region. A first photoresist pattern and a second photoresist pattern may be formed on the variable mask layer, wherein the first photoresist pattern has a first thickness and a first width in the first region, and the second photoresist pattern has a second thickness greater than the first thickness and a second width wider than the first width in the second region. A first mask pattern and a first variable mask pattern may be formed in the first region, and a second mask pattern and a second variable mask pattern may be formed in the second region, by sequentially etching the variable mask layer and the dual mask layer by using, as etch masks, the first photoresist pattern and the second photoresist pattern, wherein the first mask pattern may include a first portion of the dual mask layer, and the first variable mask pattern may be a first remaining portion of the variable mask layer and has a first thickness, and wherein the second mask pattern may include a second portion of the dual mask layer, and the second variable mask pattern may be a second remaining portion of the variable mask layer and may have a second thickness that is greater than the first thickness. First spacers covering side walls of the first mask pattern and second spacers covering side walls of the second mask pattern may be simultaneously formed. The first mask pattern may be removed. The substrate in the first region and the second region is simultaneously etched using the first spacers as an etch mask in the first region, and the second mask pattern and the second spacers as an etch mask in the second region.

Some embodiments provide that forming the first photoresist pattern and second photoresist pattern may include forming a photoresist layer on the variable mask layer in the first region and the second region; forming a photoresist pattern of which the thickness in the first region is smaller than in the second region by exposing only a portion of the photoresist layer in the first region and then developing the exposed portion of the photoresist layer; and forming the first photoresist pattern and the second photoresist pattern by patterning the photoresist pattern.

In some embodiments, forming the first photoresist pattern and the second photoresist pattern may include forming a photoresist layer on the variable mask layer in the first region and the second region; forming a plurality of photoresist patterns having the same thickness in the first region and the second region by patterning the photoresist layer; and reducing a thickness of each of the photoresist patterns in the first region from among the plurality of photoresist patterns by exposing only a portion of the plurality of photoresist patterns in the first region and then developing the exposed portion of the plurality of photoresist patterns.

Some embodiments provide that forming the first photoresist pattern and second photoresist pattern may include forming a photoresist layer on the variable mask layer in the first region and the second region; exposing a portion of the photoresist layer in the first region through a first photomask having a transmittance greater than 0%, and exposing a portion of the photoresist layer in the second region through a second photoresist on which a light absorbing pattern having a transmittance of 0%; and developing the photoresist layer. In some embodiments, the first photomask and the second photomask may be connected to each other to constitute a single photomask.

In some embodiments, simultaneously forming the first spacers and the second spacers may include forming a spacer mask layer covering exposed surfaces of the first mask pattern and first variable mask pattern, and exposed surfaces of the second mask pattern and second variable mask pattern; and forming the first spacers and second spacers including a remaining portion of the spacer mask layer by etching the spacer mask layer. In addition, the forming of the first spacers and the second spacers may include etching the spacer mask layer until the first variable mask pattern is completely removed so that an upper surface of the first mask pattern is exposed.

Some embodiments provide that removing the first mask pattern may be performed when the second variable mask pattern covers an upper surface of the second mask pattern.

In some embodiments, etching the substrate may include forming an isolation trench in the first region and second region.

Some embodiments provide that the substrate may include an etched layer, wherein the dual mask layer may be formed on the etched layer, and the etching of the substrate may include etching the etched layer.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention in which:

FIG. 2 is a layout of a portion of a semiconductor device that may be realized by methods of forming patterns of semiconductor devices in accordance with some embodiments of the present invention;

FIG. 4 is a layout of a portion of a semiconductor device that may be realized by methods of forming patterns of semiconductor devices in accordance with some embodiments of the present invention;

FIGS. 5A through 5F are cross-sectional views for describing methods of forming patterns of semiconductor devices in accordance with some embodiments of the present invention;

FIGS. 7A and 7B through 13A and 13B are diagrams for describing methods of forming patterns of semiconductor devices in accordance with some embodiments of the present invention; that is, FIGS. 7A, 8A, 9A, 10A, 11A, 12A and 13A are plan views of rectangular portions indicated by "VI_A" and "VI_B" of FIG. 6, and FIGS. 7B, 8B, 9B, 10B, 11B, 12B and 13B are cross-sectional views of portions taken along lines 8A-8A', 8B-8B', 8C-8C', and 8D-8D' in the rectangular portions indicated by "VI_A" and "VI_B" of FIG. 6.

DETAILED DESCRIPTION OF THE EMBODIMENTS

Figure 1:
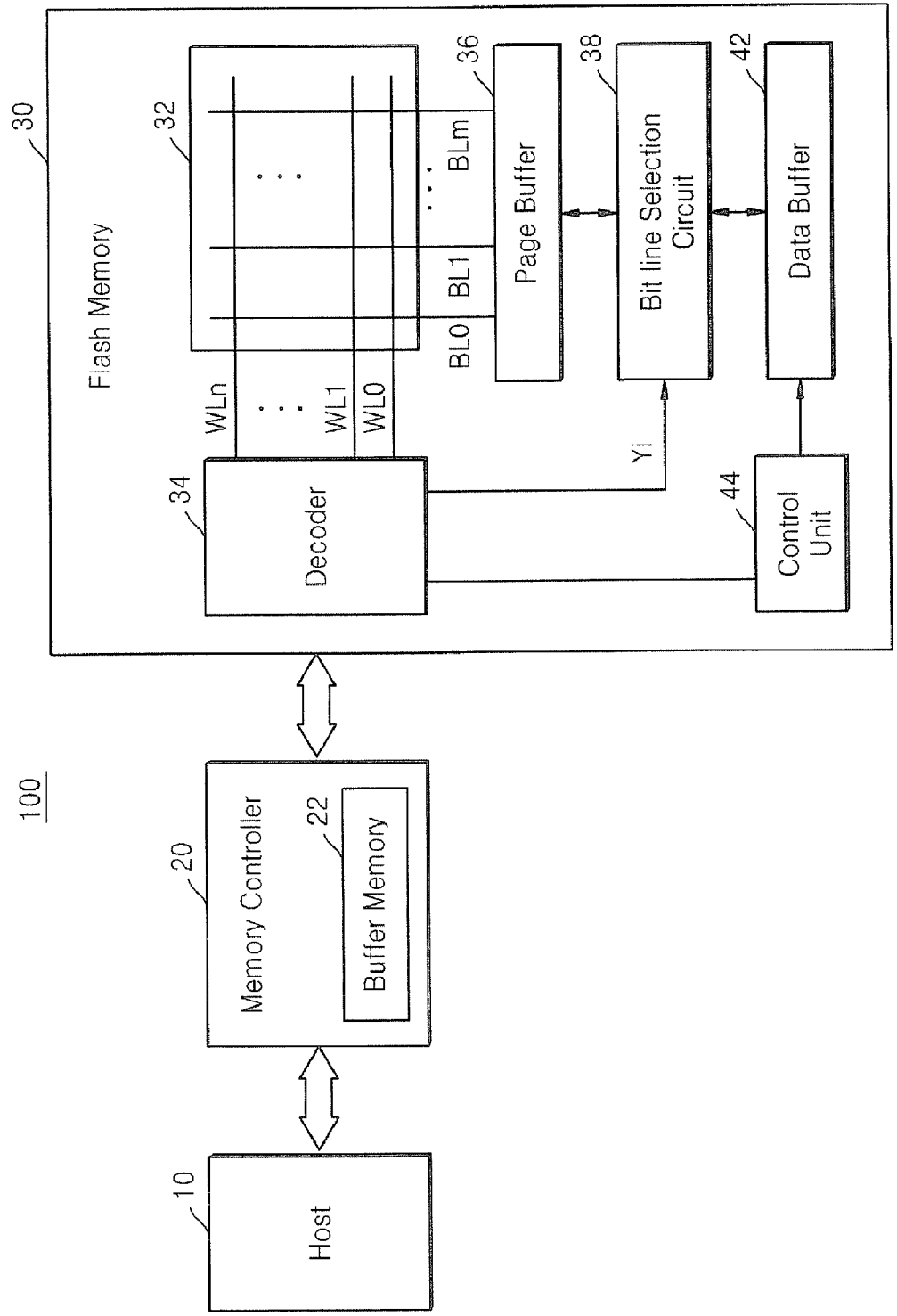
FIG. 1 is a block diagram of a memory system of a semiconductor device that may be realized by methods of forming patterns of semiconductor devices in accordance with some embodiments of the present invention.

The present invention will now be described more fully hereinafter with reference to the accompanying drawings, in which some embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region foamed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

The present invention will now be described more fully with reference to the accompanying drawings, in which exemplary embodiments of the inventive concept are shown. The present invention may, however, be embodied in many different forms and should not be construed as being limited to the embodiments set forth herein; rather, these embodiments are provided so that this disclosure will be thorough and complete, and will fully convey the present invention to one of ordinary skill in the art. In the drawings, the thicknesses and widths of layers and regions are exaggerated for clarity. Like reference numerals refer to like elements throughout. Various elements and regions in the drawings are schematically shown. Accordingly, the present invention is not limited to the relative sizes or distances shown in the attached drawings.

FIG. 1 is a block diagram of a memory system 100 of a semiconductor device that may be realized by methods of forming patterns of a semiconductor device, according to some embodiments of the present invention.

Referring to FIG. 1, the memory system 100 of the semiconductor device includes a host 10, a memory controller 20, and a flash memory 30.

The memory controller 20 may function as an interface between the host 10 and the flash memory 30, and may include a buffer memory 22. Although not illustrated in FIG. 1, the memory controller 20 may further include a central processing unit (CPU), a read only memory (ROM), a random access memory (RAM), and/or interface blocks, among others.

Some embodiments provide that the flash memory 30 may further include a cell array 32, a decoder 34, a page buffer 36, a bit line selection circuit 38, a data buffer 42, and a control unit 44.

A write command may be input from the host 10 to the memory controller 20. Then, the memory controller 20 controls the flash memory 30 so that data may be written to the cell array 32 according to the write command input. In addition, the memory controller 20 may control the flash memory 30 so as to read data stored in the cell array 32 according to a read command input from the host 10. The buffer memory 22 may temporarily store data transferred between the host 10 and the flash memory 30.

The cell array 32 of the flash memory 30 may include a plurality of memory cells. The decoder 34 is connected to the cell array 32 through word lines WL0, WL1, through WLn, where n is a natural number. The decoder 34 may receive an address from the memory controller 20 and then select one of the word lines WL0, WL1, through WLn, or generate a selection signal Yi so as to select bit lines BL0, BL1, through BLm, where m is a natural number. The page buffer 36 may be connected to the cell array 32 through the bit lines BL0, BL1, through BLm.

FIG. 2 is a layout of a portion of a semiconductor device 200 that may be realized by methods of forming patterns of semiconductor devices in accordance with some embodiments of the present invention.

Referring to FIG. 2, a first region A may be a cell array region where unit memory devices are formed. For example, the cell array 32 of FIG. 1 may be formed on the first region A. A second region B may be a peripheral circuit region and/or core region where peripheral circuits for driving the unit memory devices formed on the first region A are formed. In addition, the second region B may be a portion of the cell array region where relatively wide-width patterns are formed.

In FIG. 2, the first region A may include two first patterns 210 that each have a first width W1 that is relatively wide, and that are spaced apart from each other by a first interval D1 that is relatively small. On the first region A, the first width W1 and the first interval D1 may be designed according to the desired kind and properties of a unit memory device. For example, the first width W1 and the first interval D1 may be the same, and/or the first width W1 may be greater or smaller than the first interval D1.

The second region B may include a second pattern 220 having a second width W2 that is relatively wide.

In some embodiments, the first patterns 210 may constitute an active region and/or conductive layer of the cell array region. The second pattern 220 may constitute an active region of the peripheral circuit region. Some embodiments provide that the second pattern 220 may constitute a conductive pattern of the peripheral circuit region or cell array region. In some embodiments, the second pattern 220 may constitute an align key. As illustrated in FIG. 2, the first patterns 210 and the second pattern 220 may be spaced apart from each other. In some embodiments, although not illustrated, the first patterns 210 and the second pattern 220 may be connected to each other by a connection unit (not shown) disposed therebetween so as to constitute an integration structure.

FIGS. 3A through 3K are cross-sectional views for describing methods of forming patterns of semiconductor devices, according to some embodiments of the present invention. In FIGS. 3A through 3K, a view taken along a line IIIA-IIIA' of FIG. 2 is illustrated on the first region A, and a view taken along a line IIIB-IIIB' of FIG. 2 is illustrated on the second region B.

Figure 3A:
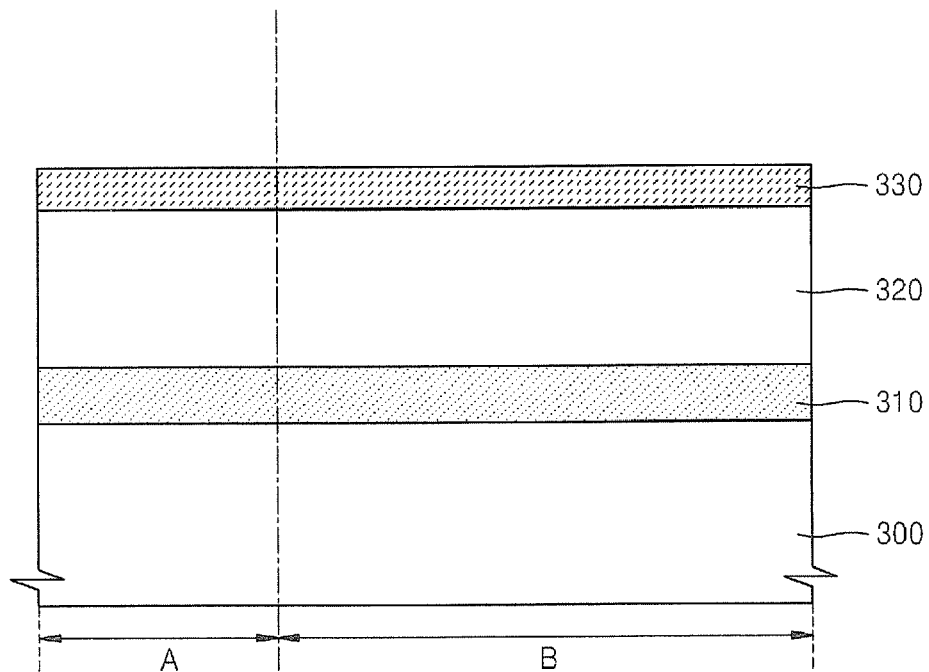
FIGS. 3A through 3K are cross-sectional views for describing methods of forming patterns of semiconductor devices in accordance with some embodiments of the present invention.

Referring to FIG. 3A, an etched layer 310, a dual mask layer 320 and a variable mask layer 330 may be sequentially formed on the first region A and the second region B of a substrate 300 in the order stated.

The substrate 300 may be a general semiconductor substrate such as a silicon substrate.

The etched layer 310 may be a conductive layer and/or an insulating layer, and may be formed of, for example, metal, a semiconductor and/or an insulating material, among others. In FIG. 2, when the first patterns 210 and the second pattern 220 are each an active region pattern formed on the substrate 300, the etched layer 310 may be omitted.

A portion of the dual mask layer 320 formed on the first region A may be used as a sacrificial layer for forming a plurality of etch mask patterns having a doubled pattern density on the first region A. A portion of the dual mask layer 320 formed on the second region B may be a portion of an etch mask for forming a desired pattern on the second region B.

The dual mask layer 320 may be formed of various materials according to the kind of the etched layer 310. For example, the dual mask layer 320 may include an amorphous carbon layer (ACL) and/or a carbon-containing layer, among others. In some embodiments, the dual mask layer 320 may be formed of any one material selected from silicon-containing materials such as $SiO_2$, $Si_3N_4$, SiCN, and/or polysilicon, among others.

The dual mask layer 320 may be formed using a spin coating method and/or a chemical vapor deposition (CVD) method, among others. For example, the dual mask layer 320 may be formed of a carbon-containing layer according to the following operations. First, an organic compound layer having a thickness of about 1000 to about 5000 Å is formed on the etched layer 310. At this time, a spin coating technique or another deposition technique may be used, if necessary. An organic compound for forming the organic compound layer may include a hydrocarbon compound including an aromatic ring such as phenyl, benzene and/or naphthalene, among others, and/or a derivative of the hydrocarbon compound. The organic compound may be formed of a material in which the amount of carbon is relatively high and is in the range of about 85 to about 99 wt % based on the total weight of the material. A carbon-containing layer may be formed by performing first baking on the organic compound layer at a temperature in the range of about 150 to about 350° C. for about 60 seconds. Then, the carbon-containing layer may be cured by performing second baking on the carbon-containing layer at a temperature in the range of about 300 to about 550° C. for about 30 to about 300 seconds. By curing the carbon-containing layer in the second baking, even if a deposition process is performed at a temperature of about 400° C. or more that is relatively high when a layer formed of a material different from the carbon-containing layer is formed on the carbon-containing layer, the carbon-containing layer may not be adversely affected by the high temperature during the deposition process.

The variable mask layer 330 may function as an etch mask on the dual mask layer 320 according to the width of each of a first photoresist pattern 340A and a second photoresist pattern 340B of a photoresist layer 340 formed on the variable mask layer 330. The variable mask layer 330 may have the same thickness on the first region A and the second region B. Alternatively, although not illustrated, some embodiments provide that the variable mask layer 330 may be formed so that the thickness of a portion of the variable mask layer 330 formed on the first region A may be smaller than a portion of the variable mask layer 330 formed on the second region B, if necessary.

The variable mask layer 330 may be formed of a material having a different etch selectivity from that of the dual mask layer 320 so as to be used as an etch mask on the dual mask layer 320. For example, the variable mask layer 330 may be formed of any material selected from a silicon-containing material such as SiON, $SiO_2$, $Si_3N_4$, SiCN, and/or polysilicon, among others. In some embodiments, the variable mask layer 330 may be formed of metal and/or an organic material.

Figure 3B:
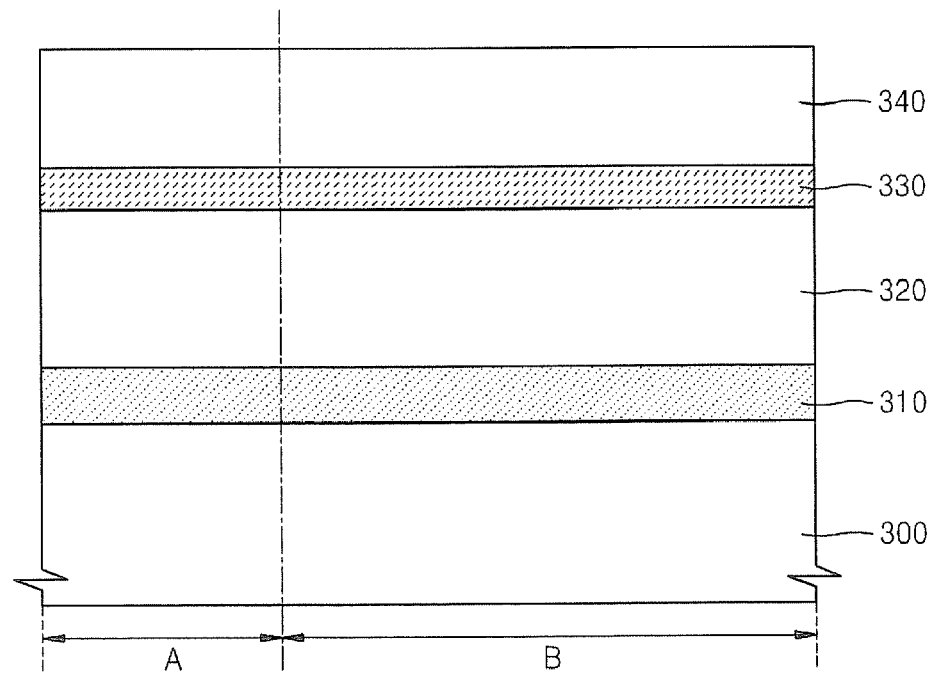

Referring to FIG. 3B, a photoresist layer 340 is formed on the variable mask layer 330. The photoresist layer 340 may be formed so as to have the same thickness on the first region A and the second region B. The photoresist layer 340 may be a positive-type or negative-type photoresist layer. In embodiments as illustrated, the photoresist layer 340 may be a positive-type photoresist layer.

Figure 3C:
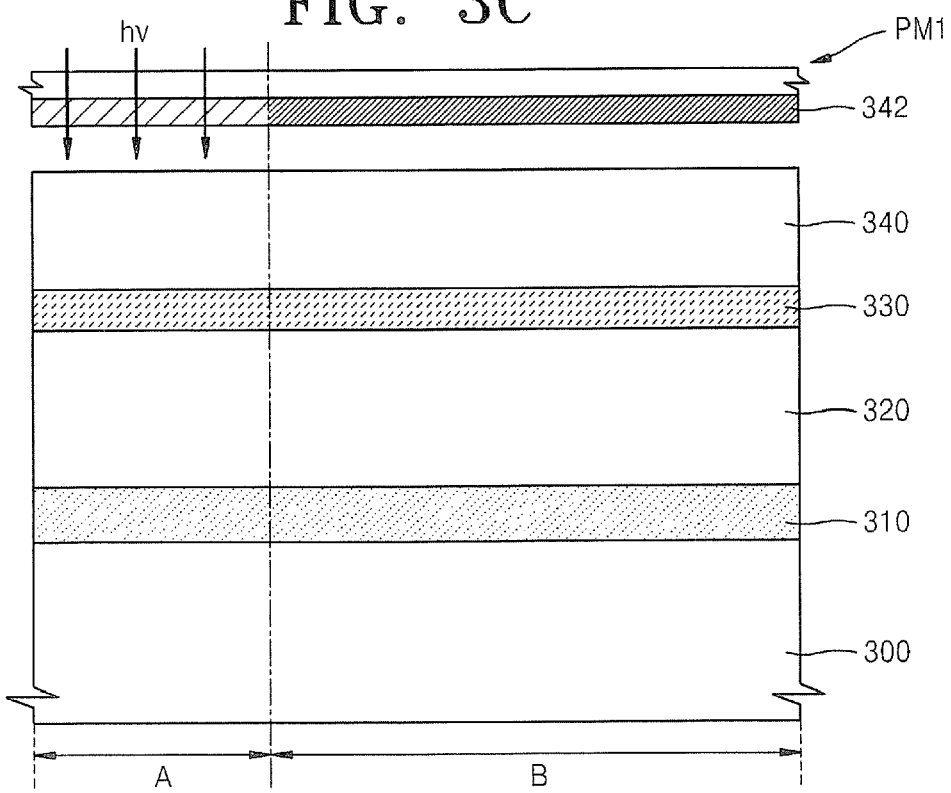

Referring to FIG. 3C, the photoresist layer 340 may be exposed via a first photomask PM1 of which the transmittances may be different on the first region A and the second region B. The transmittance of the first photomask PM1 on the first region A may be greater than that of the first photomask PM1 on the second region B. For example, the transmittance of the first photomask PM1 on the first region A may be selected from the range of 0 to 30%. In some embodiments, the first photomask PM1 may be completely covered by a light absorbing layer 342 such as a chrome (Cr) layer on the second region B, and thus the transmittance of the first photomask PM1 on the second region B may be substantially 0%.

Figure 3D:
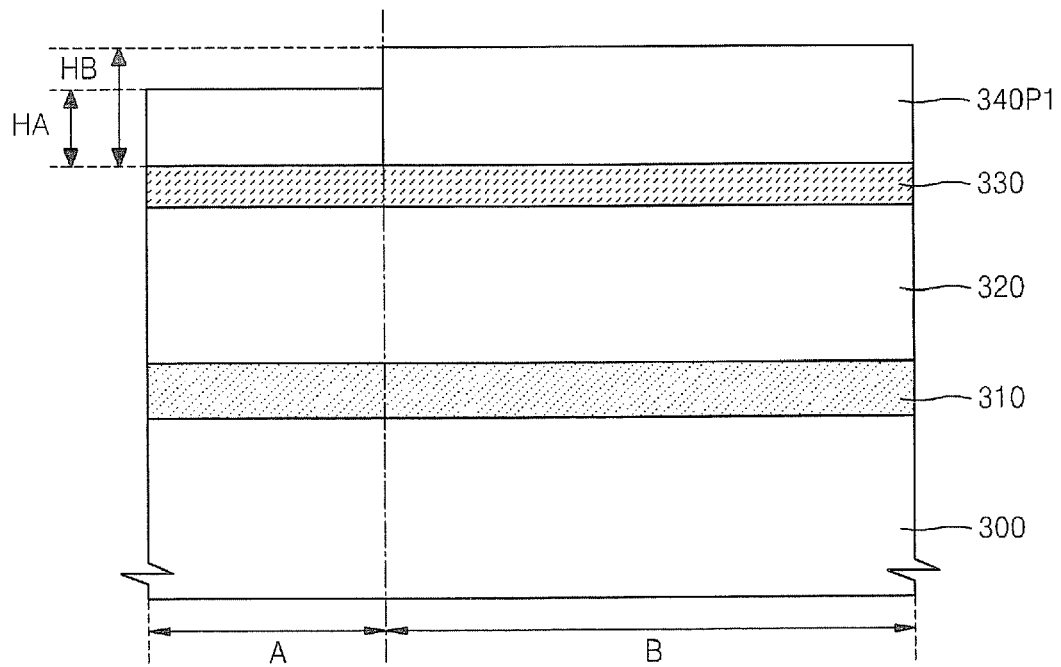

Referring to FIG. 3D, a photoresist pattern 340P1, of which the thicknesses may be different on the first region A and the second region B, may be formed by developing the photoresist layer 340 exposed via the first photomask PM1.

Since the photoresist layer 340 is exposed via the first photomask PM1 having a transmittance greater than 0% on the first region A, a portion of the photoresist layer 340 may be removed from its top surface by a selected thickness during the developing of the photoresist layer 340. In some embodiments, since the photoresist layer 340 is not exposed on the second region B, the photoresist layer 340 may not be removed during the developing of the photoresist layer 340. As a result, the photoresist pattern 340P1 having different thicknesses on the first region A and the second region B may be formed. For example, a thickness HA of the photoresist pattern 340P1 on the first region A may be smaller than a thickness HB of the photoresist pattern 340P1 on the second region B.

Figure 3E:
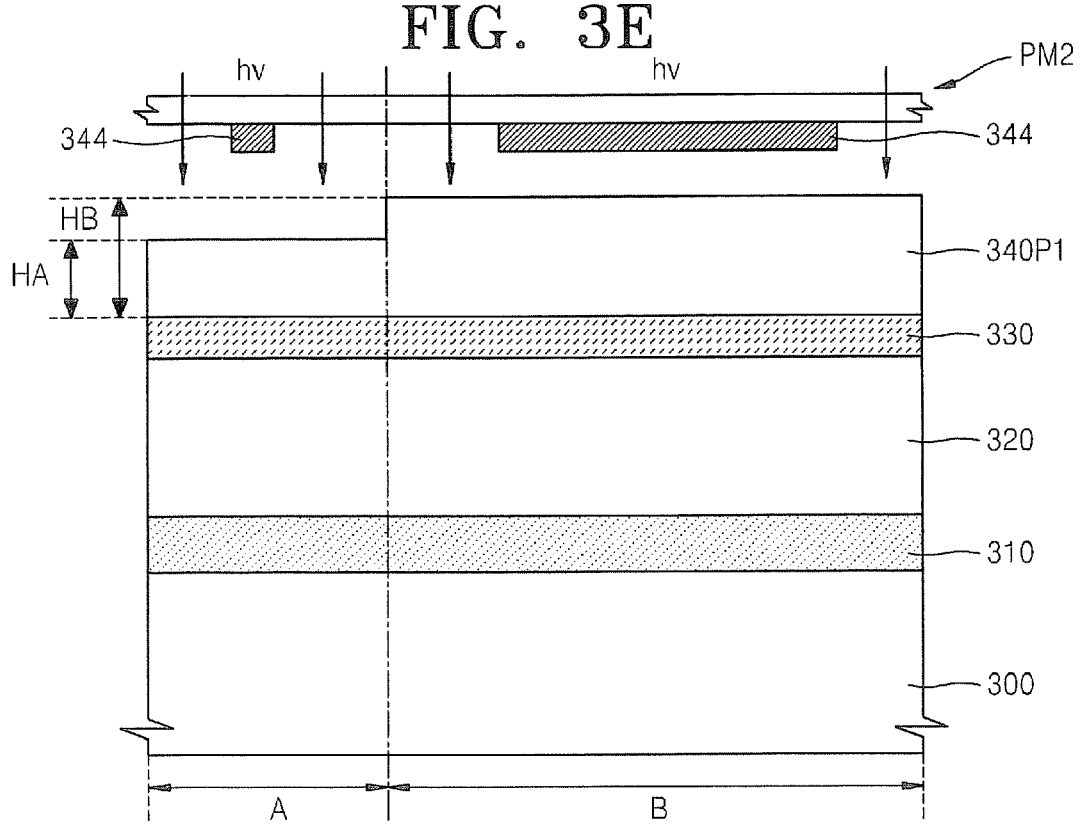

Referring to FIG. 3E, the photoresist pattern 340P1 may be exposed via a second photomask PM2 on which light absorbing patterns 344 having a selected shape may be respectively formed on the first region A and the second region B. The second photomask PM2 may include a binary photomask including a Cr light absorbing pattern formed on a quartz substrate.

Figure 3F:
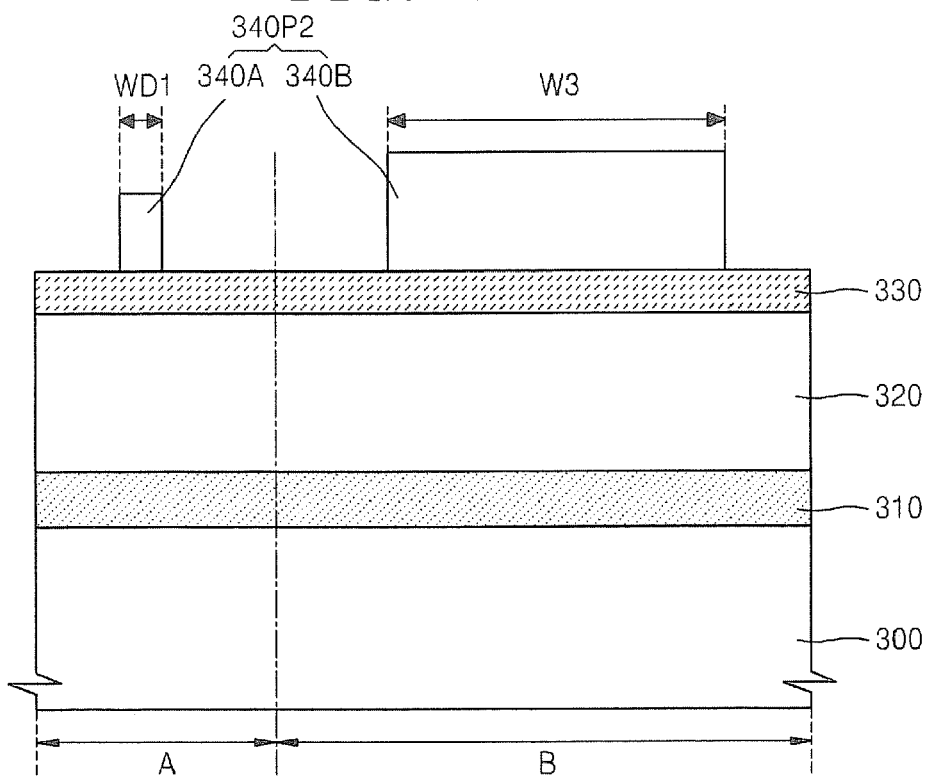

Referring to FIG. 3F, a plurality of photoresist patterns 340P2 having different thicknesses on the first region A and the second region B may be formed by developing the photoresist pattern 340P1 exposed via the second photomask PM2.

Each of the photoresist patterns 340P2 may include a first photoresist pattern 340A and a second photoresist pattern 340B. The first photoresist pattern 340A may have a fine width WD1 corresponding to the first interval D1 between the two first patterns 210 (refer to FIG. 2) that are adjacent to each other from among a plurality of patterns that are to be finally formed on the first region A. The second photoresist pattern 340B may have a third width W3 that is smaller than the second width W2 of the second pattern 220 (refer to FIG. 2) that is to be finally formed on the second region B. With respect to a top surface of the variable mask layer 330, the thickness of the first photoresist pattern 340A formed on the first region A may be smaller than that of the second photoresist pattern 340B formed on the second region B.

According to some embodiments, the first photoresist pattern 340A and the second photoresist pattern 340B are formed on the first region A and the second region B, respectively, by forming the photoresist layer 340, exposing and developing the photoresist layer 340 via the first photomask PM1 and then exposing and developing the photoresist layer 340 via the second photomask PM2, as described with reference to FIGS. 3C through 3F. Some embodiments provide that, although not illustrated, a desired result may be obtained by forming the photoresist layer 340, exposing and developing the photoresist layer 340 via the second photomask PM2 and then exposing and developing the photoresist layer 340 via the first photomask PM1. In some embodiments, although not illustrated, the resulting structure of FIG. 3F may be obtained by performing a single exposure process and a single developing process on the photoresist layer 340 via only a single photomask rather than performing two exposure processes and two developing processes on the photoresist layer 340 via the first photomask PM1 and the second photomask PM2, as described with reference to FIGS. 3C through 3F. To achieve this, an attenuated phase shift mask (attPSM) formed by adding a layer formed of Mo to a general binary photomask may be used as the single photomask. For example, a structure including a pattern formed of a material having a transmittance in the range of 0 to 30%, instead of a Cr light absorbing pattern, may be formed on the first region A of the attPSM, and a binary photomask structure including a Cr light absorbing pattern having a transmittance of substantially 0% may be formed on the second region B of the attPSM.

In the photoresist patterns 340P2, the fine width WD1 of the first photoresist pattern 340A formed on the first region A may correspond to a minimum feature size of a semiconductor device to be formed, and the third width W3 of the second photoresist pattern 340B formed on the second region B may be greater than the minimum feature size. For example, the fine width WD1 of the first photoresist pattern 340A may have a size of several to several tens of nanometers.

Figure 3G:
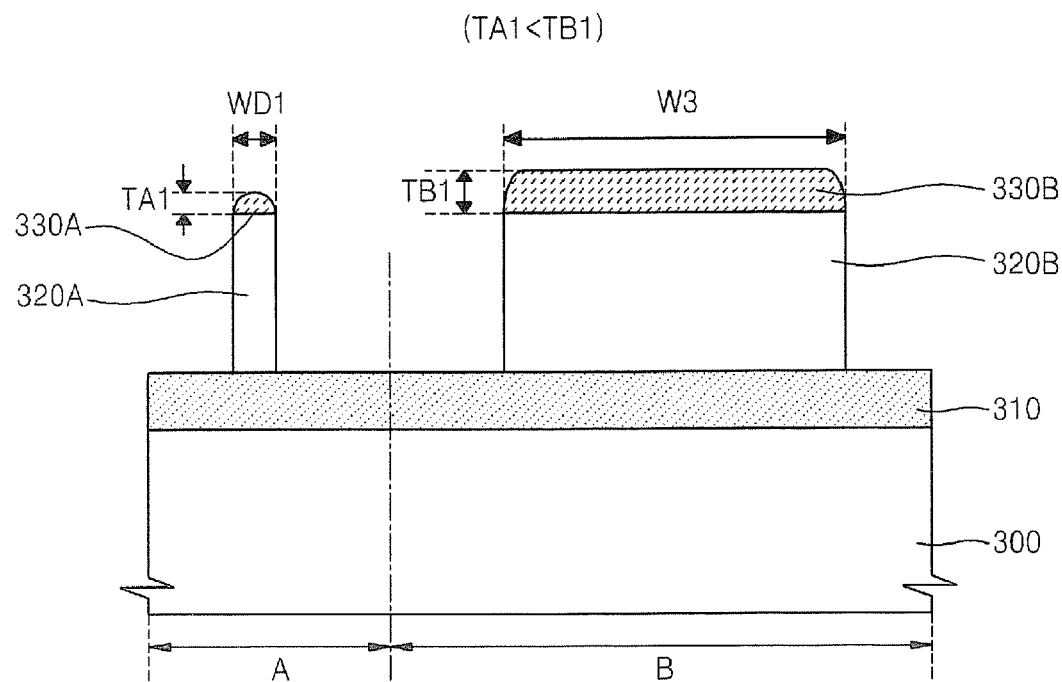

Referring to FIG. 3G, a first variable mask pattern 330A may be formed on the first region A, and a second variable mask pattern 330B may be formed on the second region B by etching the variable mask layer 330 by using the photoresist patterns 340P2 each including the first photoresist pattern 340A and the second photoresist pattern 340B as an etch mask on the first region A and the second region B. Then, the dual mask layer 320 may be etched using the first variable mask pattern 330A and the second variable mask pattern 330B as an etch mask until the etched layer 310 is exposed. As a result, due to a difference in the thickness between the first photoresist pattern 340A and the second photoresist pattern 340B, a top surface of the first variable mask pattern 330A disposed below the first photoresist pattern 340A having a relatively-small thickness is exposed earlier than a top surface of the second variable mask pattern 330B, while the first photoresist pattern 340A and the second photoresist pattern 340B are being consumed during the etching of the dual mask layer 320. While the dual mask layer 320 is being etched, the first variable mask pattern 330A of which the top surface is exposed earlier may also be consumed. A first mask pattern 320A and a second mask pattern 320B may be respectively formed on the first region A and the second region B by etching the dual mask layer 320 until the etched layer 310 is exposed so that a thickness TA1 of a portion of the first variable mask pattern 330A remaining on the first mask pattern 320A may be smaller than a thickness TB1 of the second variable mask pattern 330B remaining on the second mask pattern 320B.

The first mask pattern 320A formed on the first region A may have a width corresponding to the fine width WD1 of the first photoresist pattern 340A. In addition, the second mask pattern 320B formed on the second region B may have a width corresponding to the third width W3 of the second photoresist pattern 340B.

During the etching of the dual mask layer 320, the second photoresist pattern 340B disposed on the second variable mask pattern 330B on the second region B may be consumed and removed. Some embodiments provide, although not illustrated, that a portion of the second photoresist pattern 340B may remain on the second variable mask pattern 330B. Depending on the case, the first variable mask pattern 330A disposed on the first mask pattern 320A may be completely consumed on the first region A, and thus a top surface of the first mask pattern 320A may be exposed.

In FIG. 3G, a dry etch process may be used in order to etch the dual mask layer 320. For example, when the dual mask layer 320 is formed of a carbon-containing layer, as described above with reference to FIG. 3A, a plasma etching process using a mixed gas of $O_2$ and/or Ar may be performed in order to etch the dual mask layer 320.

Figure 3H:
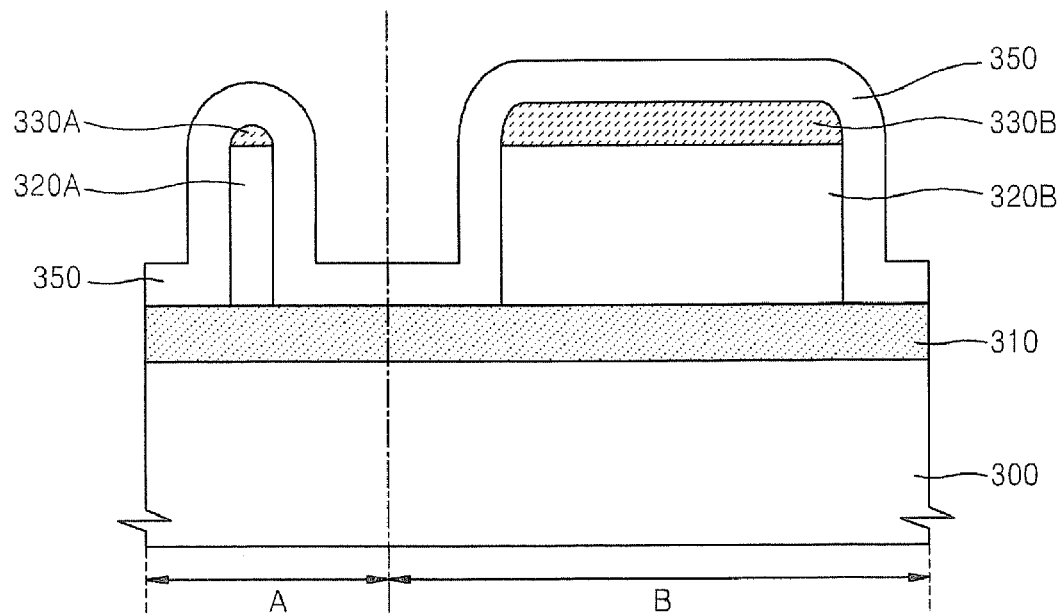

Referring to FIG. 3H, when the first variable mask pattern 330A remains on the first mask pattern 320A, and the second variable mask pattern 330B remains on the second mask pattern 320B, a spacer mask layer 350 covering exposed surfaces of the first mask pattern 320A, the first variable mask pattern 330A, the second mask pattern 320B, the second variable mask pattern 330B and the etched layer 310 may be formed. Some embodiments provide that the spacer mask layer 350 may have a uniform thickness on the first region A and the second region B.

After the operation of FIG. 3G is performed, when the first variable mask pattern 330A is completely consumed on the first region A so that a top surface of the first mask pattern 320A is exposed, the spacer mask layer 350 may be formed so as to cover the top surface of the first mask pattern 320A on the first region A.

In some embodiments, the thickness of the spacer mask layer 350 may be determined according to the first width W1 of the first pattern 210 (refer to FIG. 2) to be formed on the first region A. Some embodiments provide that the thickness of the spacer mask layer 350 may be the same as the first width W1. In some embodiments, the thickness of the spacer mask layer 350 may be greater or smaller than the first width W1.

The spacer mask layer 350 may be formed of a material having a different etch selectivity with respect to the first variable mask pattern 330A and/or the second variable mask pattern 330B, the first mask pattern 320A and/or the second mask pattern 320B, and/or the etched layer 310. Some embodiments provide that the spacer mask layer 350 may be an oxide film. An atomic layer deposition (ALD) process may be used in order to form the spacer mask layer 350 on the substrate 300 with a uniform thickness.

Figure 3I:
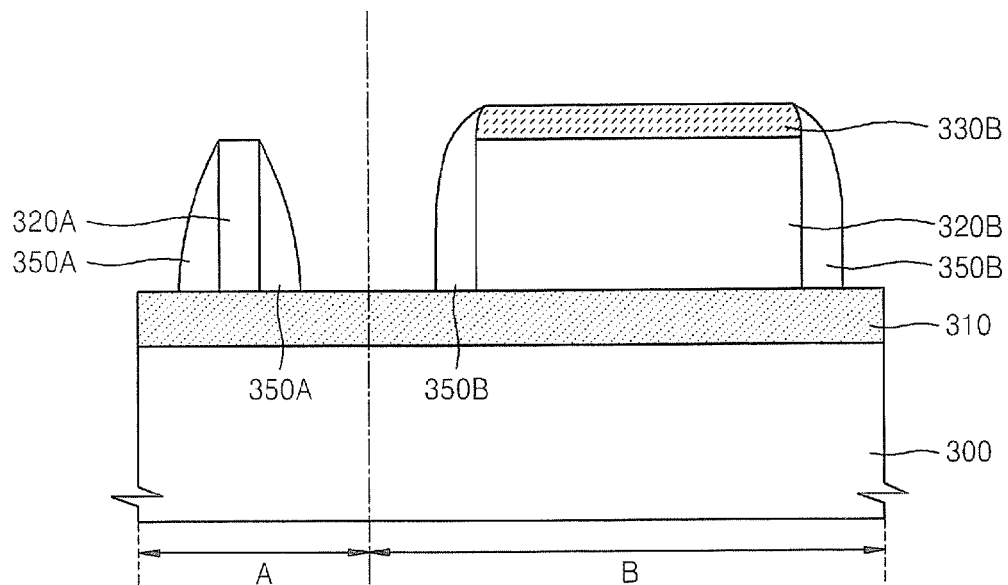

Referring to FIG. 3I, by etching the spacer mask layer 350, first spacers 350A covering side walls of the first mask pattern 320A, respectively, may be formed on the first region A, and second spacers 350B covering side walls of the second mask pattern 320B, respectively, may be formed on the second region B. To do this, a top surface of the etched layer 310 is exposed on the first region A and the second region B. Then, an etch process is performed until the first variable mask pattern 330A is completely removed so that a top surface of the first mask pattern 320A is exposed on the first region A. Since the thickness TB1 (refer to FIG. 3G) of the second variable mask pattern 330B on the second region B is greater than the thickness TA1 (refer to FIG. 3G) of the first variable mask pattern 330A on the first region A, the second variable mask pattern 330B remains on the second mask pattern 320B so as to cover the top surface of the second mask pattern 320B even if the first variable mask pattern 330A is completely removed.

The first spacers 350A may be used as an etch mask for doubling a pattern density on the first region A, and the second spacers 350B may be used as a portion of an etch mask for forming a wide-width pattern that is wider than a pattern of the first region A.

In order to etch the spacer mask layer 350 until the first variable mask pattern 330A is removed, the first variable mask pattern 330A may be exposed by etching the spacer mask layer 350, and continually the first variable mask pattern 330A may be etched in-situ in the same chamber under the same etch conditions as for the spacer mask layer 350 until the first variable mask pattern 330A is removed.

In the operation of FIG. 3I, in order to etch the spacer mask layer 350, for example, a CxFy gas (x and y are integers of 1 to 10) and/or a CHxFy gas (x and y are integers of 1 to 10) may be used as a main etch gas. In some embodiments, at least one selected from $O_2$ and Ar may be added to the main etch gas. For example, $C_3F_6$, $C_4F_6$, $C_4F_8$ and/or $C_5F_8$, among others, may be used as the CxFy gas. In addition, $CHF_3$ and/or $CH_2F_2$ may be used as the CHxFy gas. $O_2$ added to the main etch gas may remove a polymer residue generated during an etch process, and may decompose the CxFy gas. Ar added to the main etch gas may be used a carrier gas, and may facilitate ion bombarding. The spacer mask layer 350 may be etched under a plasma atmosphere by generating plasma of an etch gas selected from the above-described etch gases in an etch chamber. Depending on the case, plasma is not generated in the etch chamber, and the spacer mask layer 350 may be etched under the selected etch gas atmosphere without an ion energy. For example, in order to etch the spacer mask layer 350, a mixed gas of $C_4F_6$, $CHF_3$, $O_2$ and/or Ar may be used as an etch gas. In this case, a dry etch process of a plasma method may be performed on the spacer mask layer 350 at a pressure of about 30 mT for several to several tens of seconds while $C_4F_6$, $CHF_3$, $O_2$ and/or Ar are supplied. Some embodiments provide that a volume ratio of $C_4F_6$:$CHF_3$:$O_2$: Ar may be about 1:6:2:14.

In the operation of FIG. 3I, when the first variable mask pattern 330A remains on the first mask pattern 320A on the first region A rather than being completely removed, a process of selectively removing only the first variable mask pattern 330A on the first region A may be further performed in order to expose only a top surface of the first mask pattern 320A. When the first variable mask pattern 330A is removed, a difference in the etch selectivity of the first variable mask pattern 330A with respect to the first mask pattern 320A and/or the second mask pattern 320B, the first spacers 350A and/or the second spacers 350B, and/or the etched layer 310 may be used. The first variable mask pattern 330A may have a smaller thickness than that of the second variable mask pattern 330B, even if the first variable mask pattern 330A and the second variable mask pattern 330B are formed of the same material. When the first variable mask pattern 330A is completely removed on the first region A, the second variable mask pattern 330B on the second region B may remain on the top surface of the second mask pattern 320B so as to cover the top surface of the second mask pattern 320B without a considerable reduction in the thickness of the second variable mask pattern 330B.

In order to remove the first variable mask pattern 330A, a dry etch process or a wet etch process may be used. For example, when the first variable mask pattern 330A is formed of SiON and/or $Si_3N_4$, a CHxFy gas (x and y are integers of 1 to 10) may be used as a main etch gas in order to remove the first variable mask pattern 330A. In some embodiments, a mixed gas of a CxFy gas (x and y are integers of 1 to 10) and/or a CHxFy gas (x and y are integers of 1 to 10) may be used as the main etch gas. If necessary, $O_2$, Ar, and/or a halogens compound may be further provided. For example, in order to remove the first variable mask pattern 330A, a mixed gas of $CH_2F_2$, $CHF_3$, $O_2$ and/or Ar may be used as an etch gas. In this case, a dry etch process of a plasma method may be performed on the first variable mask pattern 330A at a pressure of about 40 mT for several to several tens of seconds while $CH_2F_2$, $CHF_3$, $O_2$ and/or Ar are supplied. Some embodiments provide that a volume ratio of $CH_2F_2$:$CHF_3$:$O_2$:Ar may be about 4:1:5:9.

Figure 3J:
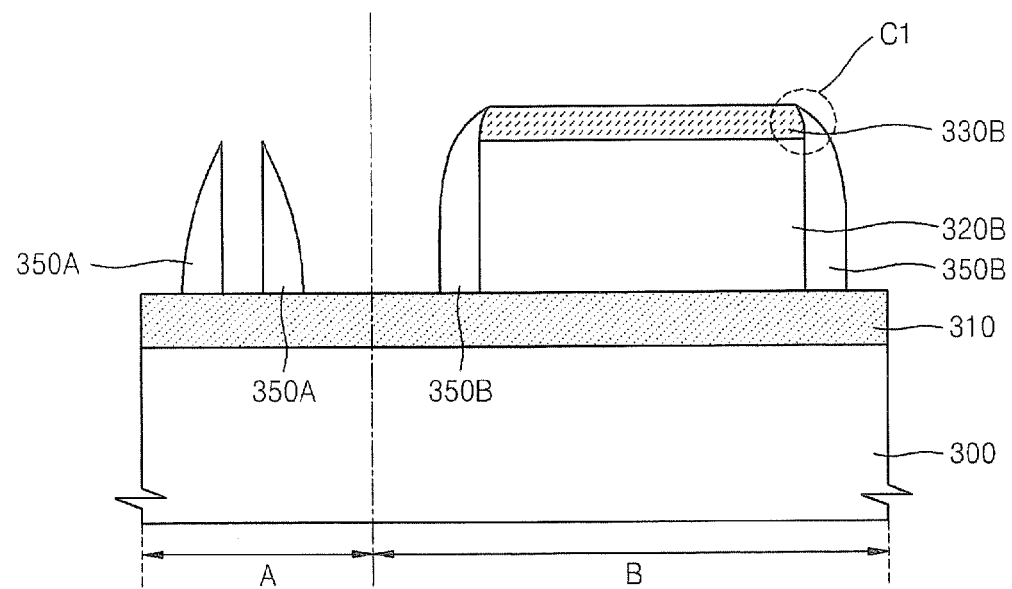

Referring to FIG. 3J, the first mask pattern 320A exposed on the first region A may be removed so as to expose the etched layer 310 through a space between two first spacers 350A that are adjacent to each other on the first region A. As indicated within the dashed line "C1" of FIG. 3J, since a portion of the second spacer 350B is in contact with a portion of the second variable mask pattern 330B on the second region B, the second mask pattern 320B may be completely covered by the second spacers 350B and the second variable mask pattern 330B, and thus the second mask pattern 320B may not be exposed. Thus, while the first mask pattern 320A is removed on the first region A, the second mask pattern 320B on the second region B may be protected by the second variable mask pattern 330B and the second spacers 350B from being removed and thus remains.

The first mask pattern 320A may be etched under a condition where etching of the first spacers 350A on the first region A, the second variable mask pattern 330B and the second spacers 350B on the second region B, and the etched layer 310 is repressed.

When the first mask pattern 320A is formed of a carbon-containing layer, as described with reference to FIG. 3A, an ashing process or a strip process may be used to remove the first mask pattern 320A. Some embodiments provide that the first mask pattern 320A may be removed using a dry or wet etch process according to the material of the first mask pattern 320A. For example, in order to remove the first mask pattern 320A by using a dry etch process, a mixed gas of $O_2$ and Ar may be used as an etch gas. As an example, while $O_2$ and/or Ar may be supplied so that a ratio volume of $O_2$:Ar may be in the range of about 1:4 to about 1:8, a dry etch process of a plasma method may be performed on the first mask pattern 320A at a pressure of about 1 to about 30 mT and a temperature of about −10 to 40° for several to several tens of seconds. In this case, a source power of about 400 W and a bias power of about 150 W may be used.

Figure 3K:
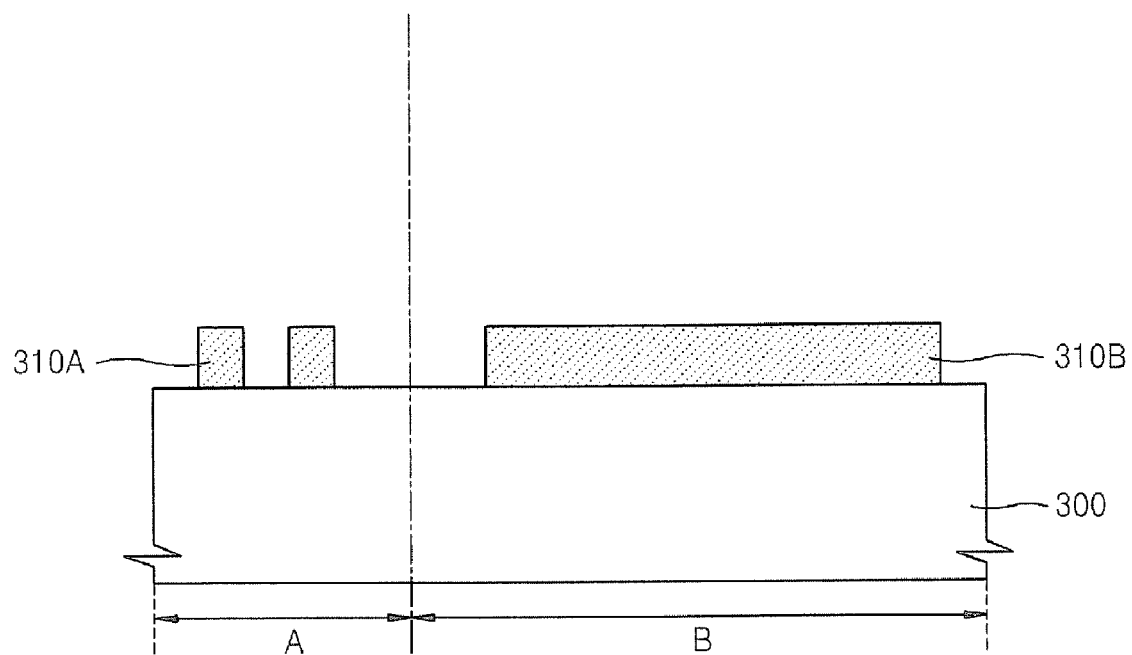

Referring to FIG. 3K, in order to etch the etched layer 310, the first spacers 350A are used as an etch mask on the first region A, and the second mask pattern 320B and the second spacers 350B covering side walls of the second mask pattern 320B are used as an etch mask on the second region B. By etching the etched layer 310, first patterns 310A and a second pattern 310B of which the widths are different are formed on the first region A and the second region B, respectively. If necessary, unnecessary layers remaining on the first patterns 310A and the second pattern 310B are removed. The first patterns 310A and the second pattern 310B may be the first patterns 210 and the second pattern 220 of FIG. 2, respectively.

According to the operations for forming patterns of a semiconductor device, described with reference to FIGS. 3A through 3K, the first patterns 310A may be formed on the first region A having patterns that are relatively small so as to have relatively narrow-width patterns of which the pattern density is doubled using a double patterning process. The double patterning process may provide that the first spacers 350A formed on side walls of the first mask pattern 320A are used as an etch mask. In addition, in order to form a wide-width pattern having a wider width than that of the first pattern 310A, formed on the first region A, as the second pattern 310B, the second pattern 310B having a relatively wide-width is formed by using, as etch masks, the second mask pattern 320B that is simultaneously formed with the first mask pattern 320A, and the second spacers 350B that are simultaneously formed with the first spacers 350A. In thin manner, patterns are simultaneously formed respectively with different widths on the first region A and the second region B. Accordingly, the photoresist patterns 340P2 (refer to FIG. 3F) may be formed, wherein each of the photoresist patterns 340P2 has a relatively-thick thickness on the second region B and a relatively-small thickness on the first region A on which the first patterns 310A each having a relatively narrow width are formed. As a result, the first variable mask pattern 330A and the second variable mask pattern 330B may be obtained, and thus a difference of the thickness between the first variable mask pattern 330A and the second variable mask pattern 330B is used. Thus, when patterns are simultaneously formed so as to respectively have different widths on the first region A and the second region B, since a separate photolithography process is not further performed, processes may be simplified, and manufacturing costs may be reduced.

FIG. 4 is a layout of a portion of a semiconductor device 400 that may be realized by methods of forming patterns of semiconductor devices, according to some embodiments of the present invention. Specifically, FIG. 4 is a layout illustrating an active region of a semiconductor memory device.

Referring to FIG. 4, a first region A may be a memory cell region where unit memory devices are formed. For example, the cell array 32 of FIG. 1 may be formed on the first region A. The second region B may be a peripheral circuit region and/or core region where peripheral circuits for driving the unit memory devices formed on the first region A are formed.

In FIG. 4, a plurality of first active regions 410, each having a first width W5 that is relatively narrow, are spaced apart from each other by a first interval D5 that is relatively small and are disposed parallel to each other on the first region A. On the first region A, the first width W5 and/or the first interval D5 may be designed according to the desired kind and/or properties of a unit memory device. The first width W5 and the first interval D5 may or may not be the same. For example, in some embodiments, the first width W5 and the first interval D5 may be determined according to the size of a single memory cell, as determined by a design rule. Each of the first width W5 and the first interval D5 may be in the range of 1 F to 3 F, where F refers to a minimum feature size in a memory cell.

A second active region 420 having a second width W6 that is relatively wide may be formed on the second region B.

FIGS. 5A through 5F are cross-sectional views for describing methods of forming patterns of semiconductor devices, according to some embodiments of the present invention. In FIGS. 5A through 5F, a view taken along a line VA-VA' of FIG. 4 is illustrated on the first region A, and a view taken along a line VB-VB' of FIG. 4 is illustrated on the second region B. The same elements in FIGS. 5A through 5F as those in FIG. 3A through 3K are denoted by the same reference numerals, and a detailed description thereof will not be given.

Referring to FIG. 5A, a pad oxide layer 502 may be formed on the first region A and the second region B of a substrate 500. A hard mask layer 504 and a buffer mask layer 510 may be sequentially formed on the pad oxide layer 502 in the order stated. Using a method described with reference to FIG. 3A, a dual mask layer 320 and a variable mask layer 330a may be sequentially formed on the buffer mask layer 510 in the order stated.

Then, using a method described with reference to FIGS. 3B through 3F, photoresist patterns 340P2 may be formed on the variable mask layer 330. The photoresist patterns 340P2 may include a plurality of first photoresist patterns 340A that are repeatedly formed at a first pitch 2P on the first region A, and a second photoresist pattern 340B formed on the second region B. A thickness HA2 of each of the first photoresist patterns 340A formed on the first region A may be smaller than a thickness HB2 of the second photoresist pattern 340B formed on the second region B.

The first photoresist patterns 340A may be formed on the first region A at the first pitch 2P that is twice as much as a pitch P of a fine pattern that is to be finally formed (see FIG. 5F). A fine width WD2 of each of the first photoresist patterns 340A may be the same as a first width W5 of the fine pattern to be formed on the substrate 500 (see FIG. 5F). If necessary, the fine width WD2 of each of the first photoresist patterns 340A may be greater or smaller than the first width W5 of the fine pattern to be formed on the substrate 500. The second photoresist pattern 340B may be formed on the second region B so as to have a third width W7 smaller than a second width W6 of the second active region 420 to be finally formed.

Some embodiments provide that the substrate 500 may be a general semiconductor substrate such as a silicon substrate.

The hard mask layer 504 may be a single layer. In some embodiments, the hard mask layer 504 may have a multi-layered structure including two or more hard mask layers having different etch properties under a selected etching condition. For example, some embodiments provide that the hard mask layer 504 may be a silicon nitride layer.

The buffer mask layer 510 may be a polysilicon layer, but the inventive concept is not limited thereto. The hard mask layer 504 and the buffer mask layer 510 may be formed of any material having different etch selectivities under a selected etching condition. If necessary, the buffer mask layer 510 may be omitted.

Figure 5B:
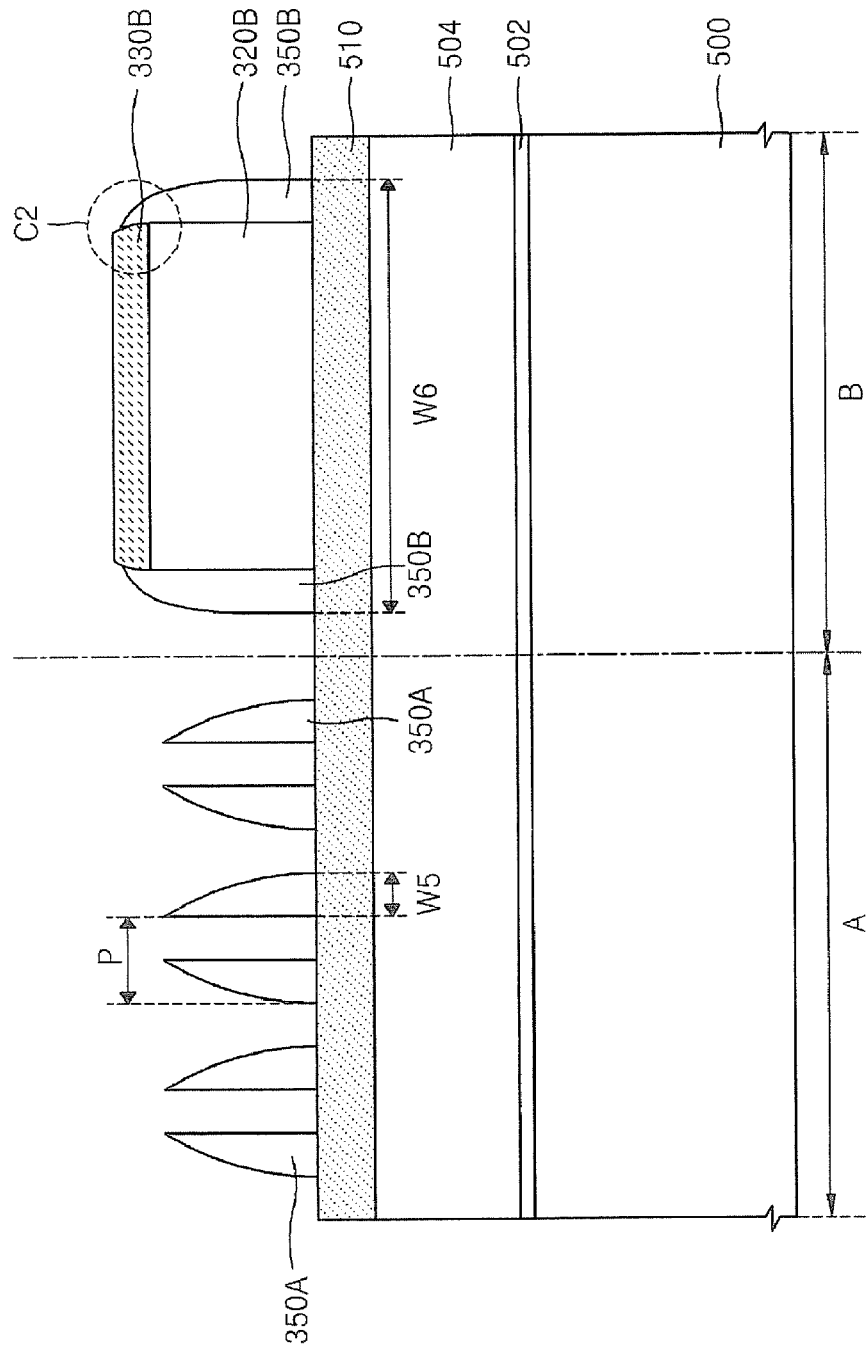

Referring to FIG. 5B, using a method described with reference to FIGS. 3G through 3J, a plurality of first spacers 350A may be formed on the buffer mask layer 510 on the first region A to respectively cover side walls of the first photoresist patterns 340A. A plurality of second spacers 350B respectively covering the side walls of the second mask pattern 320B may be formed on the buffer mask layer 510 on the second region B.

On the first region A, the first spacers 350A may be repeatedly formed at a fine pitch P that is ½ as much as the first pitch 2P (refer to FIG. 5A).

On the second region B, side walls of the second mask pattern 320B may be covered by the side walls of the second spacers 350B respectively, and the upper surface of the second mask pattern 320B may be covered by the second variable mask pattern 330B. As illustrated in the dashed circle "C2" of FIG. 5B, upper portions of the side walls of the second spacers 350B contact with portions of the second variable mask pattern 330B, and thus the second mask pattern 320B may be completely covered by the second spacers 350B and the second variable mask pattern 330B so that the second mask pattern 320B is not exposed on the second region B.

Figure 5C:
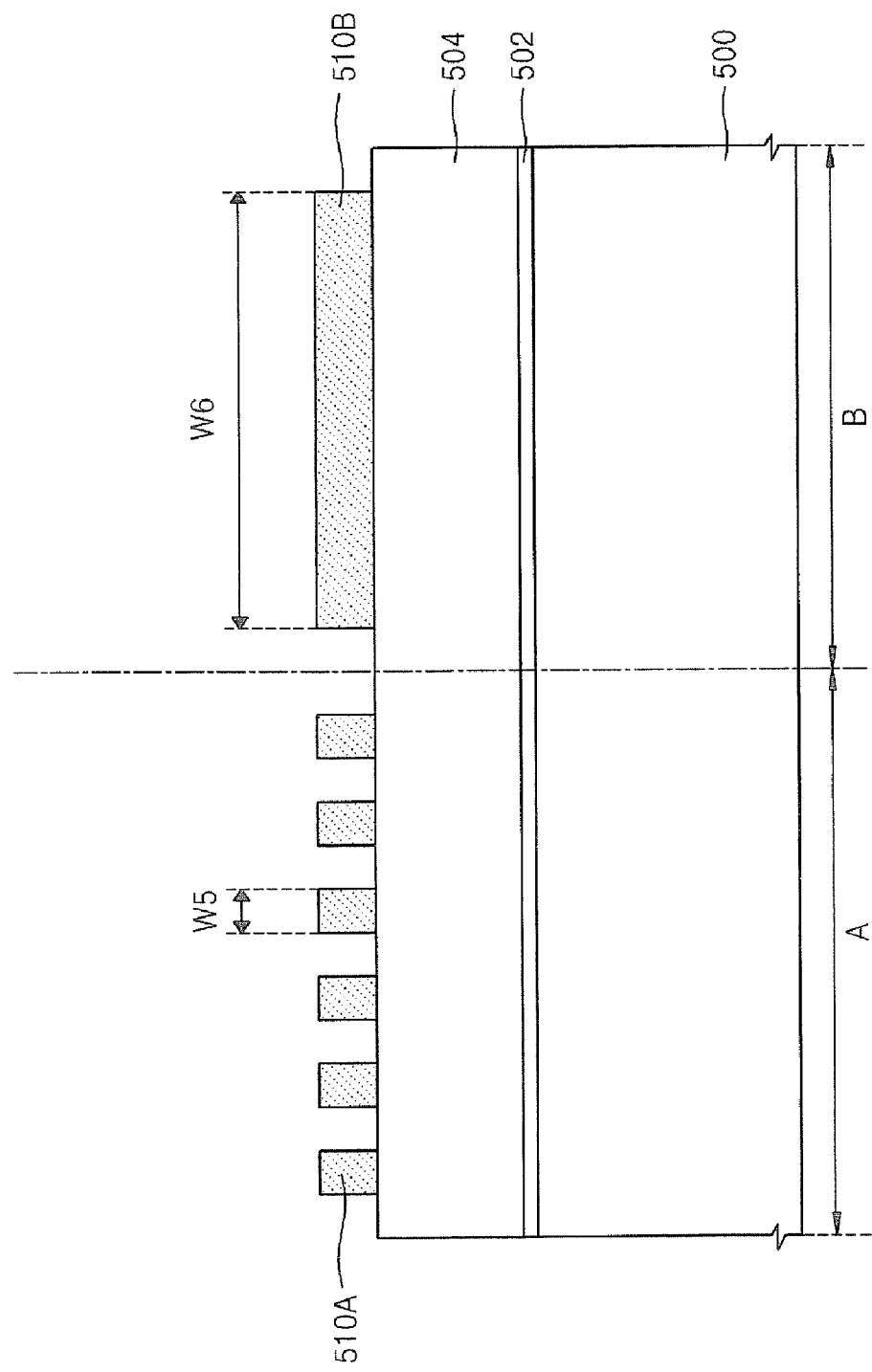

Referring to FIG. 5C, a plurality of buffer mask patterns 510A and 510E exposing the hard mask layer 504 may be formed by etching the buffer mask layer 510 using the first spacers 350A as an etch mask on the first region A and the second spacers 350B, covering the side walls of the second mask pattern 320B, as an etch mask on the second region B.

Although not illustrated, after the buffer mask patterns 510A and 510E are formed, a remaining layer of the first spacers 350A, and remaining layers of the second mask pattern 320B and the second spacers 350B may remain on the buffer mask patterns 510A and 510B.

Referring to FIG. 5D, hard mask patterns 504A and 504B may be formed on the first region A and the second region B by etching the hard mask layer 504 by using the buffer mask patterns 510A and 510B as an etch mask.

Although not illustrated, after the hard mask patterns 504A and 504B are formed, remaining layers of buffer mask patterns 510A and 510B may remain on the hard mask patterns 504A and 504B.

Referring to FIG. 5E, trenches 570A and 570B may be formed in the first and second regions A and B of the substrate 500 by etching the pad oxide layer 502 and the substrate 500 by using the hard mask patterns 504A and 504B as an etch mask.

Referring to FIG. 5F, isolation layers 572A and 572B may be formed by depositing an insulating material in the trenches 570A and 570B and on the hard mask patterns 504A and 504B to form an insulating layer in the trenches 570A and 570B and then using a planarization process such as a chemical mechanical polishing (CMP) method to planarize the insulating material until the hard mask patterns 504 and 504B are exposed.

First active regions 574A and a second active region 574B may be defined by the isolation layers 572A and 572B on the substrate 500.

The first active regions 574A defined on the first region A may constitute the first active regions 410 of FIG. 4, and may each have the first width W5 that is ¼ as much as the first pitch 2P (refer to FIG. 5A). The first active regions 574A are repeatedly formed at the fine pitch that is ½ as much as the first pitch 2P. The second active region 574B defined on the second region B may constitute the second active region 420 of FIG. 4.

According to methods of forming patterns of semiconductor devices as described with reference to FIGS. 5A through 5F, the first active regions 574A may be formed on the first region A having patterns that are relatively small, have a fine size, and a pattern density that is doubled using a double patterning process. The double patterning process may provide that the first spacers 350A that are formed respectively on side walls of the first mask pattern 320A are used as an etch mask. In addition, in order to form wide-width patterns having a wider size and/or a wider width than the those of the first region A on the second region B, the second active region 574B having a relatively wide width may be defined in the substrate 500 by using, as etch masks, the second mask pattern 320B that is simultaneously formed with the first mask patterns 320A, and the second spacers 350B that are simultaneously formed with the first spacers 350A. When the first active regions 574A and the second active region 574B having different widths are simultaneously defined on the first region A and the second region B, respectively, the photoresist patterns 340P2 (refer to FIG. 5A) may be formed, wherein each of the photoresist patterns 340P2 has a relatively small thickness on the first region A where the first active regions 574A having a relatively narrow width are defined, and a relatively thick thickness on the second region B where the second active region 674B having a relatively wide width is defined. As a result, the first variable mask patterns 330A and the second variable mask pattern 330B are obtained, and thus a difference of the thickness between the first variable mask patterns 330A and the second variable mask pattern 330B is used. Thus, when a plurality of active regions are simultaneously formed so as to have different widths on the first region A and the second region B, since a separate photolithography process is not further performed, processes may be simplified, and manufacturing costs may be reduced.

In addition, by forming isolation layers 572A in the substrate 500 as illustrated in FIGS. 5A through 5F, an isolation mask pattern may be repeatedly formed on the first region A of the substrate 500, for example, on a cell array region, at a fine pitch that is about ½ as much as a pitch of a general photolithography process. Thus, it is possible to form a plurality of active regions that have a fine width and are repeatedly formed at a fine pitch surpassing a resolution limit of a photolithography process.

Figure 6:
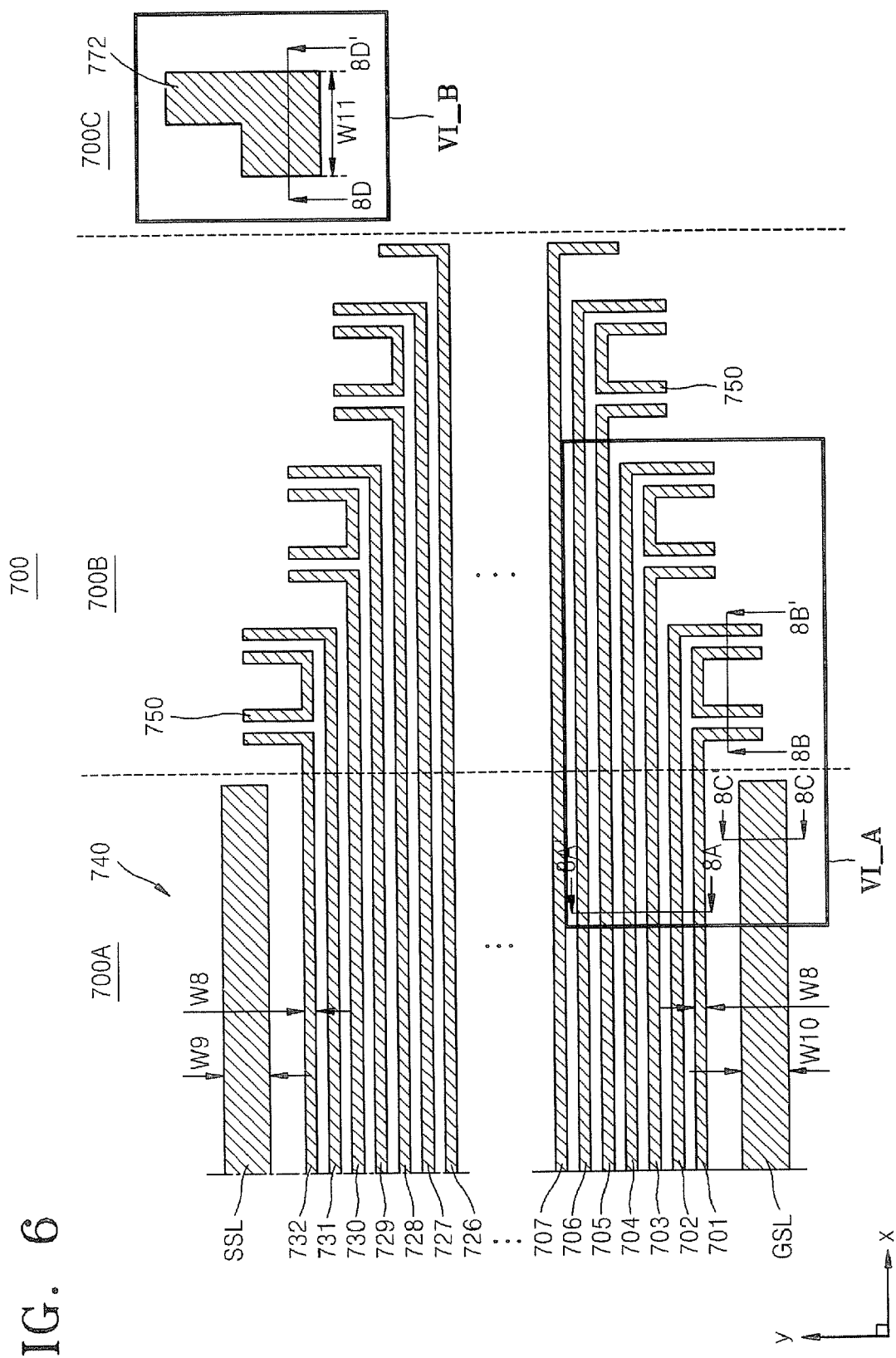
FIG. 6 is a layout of a portion of a semiconductor device that may be realized by methods of forming patterns of semiconductor devices in accordance with some embodiments of the present invention.

FIG. 6 is a layout of a portion of a semiconductor device 700 that may be realized by methods of forming patterns of semiconductor devices according to some embodiments of the present invention.

That is, FIG. 6 is a layout illustrating a portion of a memory cell region 700A of a NAND flash memory device, a portion of a connection region 700B for connecting conductive lines 701, 702, through 732 of a cell array of the memory cell region 700A and a portion of a peripheral circuit region 700C. In some embodiments, conductive lines may include, for example, word lines and/or bit lines, or lines connected to an external circuit (not shown) such as a decoder.

Referring to FIG. 6, a plurality of memory cell blocks 740 are formed on the memory cell region 700A; however, a single memory cell block 740 is illustrated for convenience of description. In the memory cell block 740, the conductive lines 701, 702, through 732 that form a single cell string extend parallel to one another between a string selection line SSL and a ground selection line GSL in a first direction (an "x" direction of FIG. 6). The conductive lines 701, 702, through 732 extend across the memory cell region 700A and the connection region 700B in the first direction.

In FIG. 6, on the connection region 700B, ends of the conductive lines 701, 702, through 732 extend in a second direction (a "y" direction of FIG. 6) perpendicular to the first direction. On the connection region 700B, the ends of the conductive lines 701, 702, through 732 are connected to the external circuit (not shown) such as a decoder. In FIG. 6, on the connection region 700B, dummy conductive lines 750 are alternately formed around two adjacent ends of conductive lines 701, 702, through 732 of the conductive lines 701, 702, through 732. However, the methods of forming patterns of semiconductor devices according to embodiments described herein are not limited only to forming the semiconductor device 700. In this regard, various changes in the arrangement and shapes of the conductive lines 701, 702, through 732 may be made therein without departing from the spirit and scope of the inventive concept.

Some embodiments provide that a peripheral circuit conductive pattern 772 may be formed on the peripheral circuit region 700C.

In FIG. 6, the conductive lines 701, 702, through 732, the string selection line SSL, the ground selection line GSL, and the peripheral circuit conductive pattern 772 may be formed of the same material. The conductive lines 701, 702, through 732 may be word lines used for a plurality of memory cells on the memory cell region 700A. In this case, the peripheral circuit conductive pattern 772 may constitute a gate electrode of a peripheral circuit transistor. The string selection line SSL and the ground selection line GSL may have widths W9 and W10, respectively, that are each greater than a width W8 of each of the conductive lines 701, 702, through 732.

As another example, the conductive lines 701, 702, through 732 may be bit lines needed for memory cells in the memory cell region 700A. In this case, the string selection line SSL and the ground selection line GSL may be omitted.

In FIG. 6, the memory cell block 740 includes 32 conductive lines, that is, the conductive lines 701, 702, through 732. However, the memory cell block 740 may include various numbers of conductive lines without departing from the spirit and scope of the present invention.

FIGS. 7A and 7B through 13A and 13B are diagrams for describing methods of forming patterns of semiconductor devices, according to some embodiments of the present invention. That is, FIGS. 7A, 8A, 9A, 10A, 11A, 12A and 13A are plan views of rectangular portions indicated by "VI_A" and "VI_B" of FIG. 6. FIGS. 7B, 8B, 9B, 10B, 11B, 12B and 13B are cross-sectional views of portions taken along lines 8A-8A', 8B-8B', 8C-8C', and 8D-8D' in the rectangular portions indicated by "VI_A" and "VI_B" of FIG. 6. The same elements in FIGS. 7A and 7B through 13A and 13B as those in FIGS. 3A through 3K are denoted by the same reference numerals, and a detailed description thereof will not be given.

In FIGS. 7B, 8B, 9B, 10B, 11B, 12B and 13B, a cross-sectional view taken long the line 8A-8A' and a cross-sectional view taken long the line 8B-8B' of FIGS. 7A, 8A, 9A, 10A, 11A, 12A and 13A are included in a first region AA where narrow-width fine patterns, for example, the conductive lines 701, 702, through 732, are to be formed by doubling a pattern density by using a double patterning process on the memory cell region 700A and the connection region 700B, respectively.

In FIGS. 7B, 8B, 9B, 10B, 11B, 12B and 13B, a cross-sectional view taken long the line 8C-8C' and a cross-sectional view taken long the line 8D-8D' of FIGS. 7A, 8A, 9A, 10A, 11A, 12A and 13A are included in a second conductive region BB where wider width patterns (hereinafter, referred to as a "wide width pattern") than in the first region AA, for example, the string selection line SSL, the ground selection line GSL, and the peripheral circuit conductive pattern 772, are to be formed on the memory cell region 700A and the peripheral circuit region 700C, respectively.

Figure 7A:
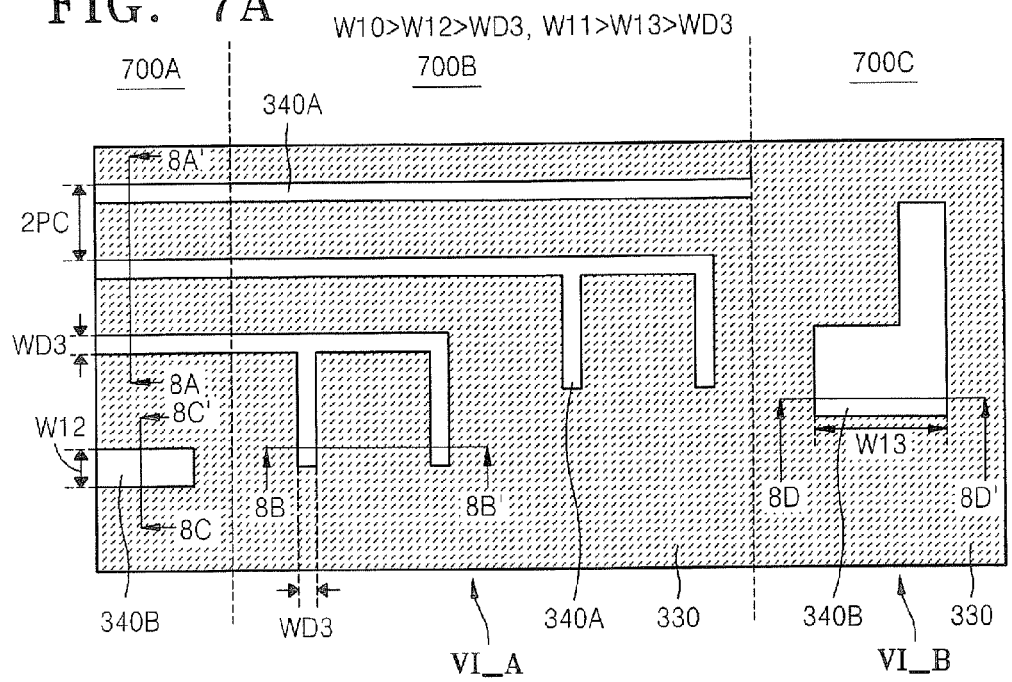
Figure 7B:
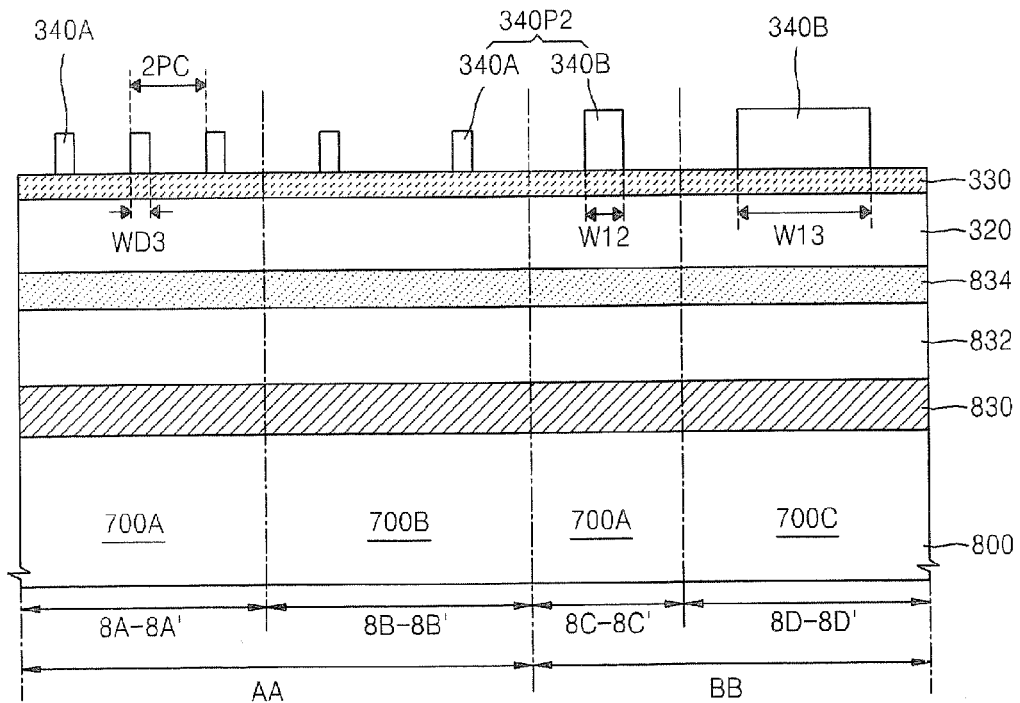

Referring to FIGS. 7A and 7B, a substrate 800 having the memory cell region 700A, the connection region 700B, and the peripheral circuit region 700C (refer to FIG. 6) is prepared.

In the first region AA and the second conductive region BB, a conductive layer 830 used to form conductive lines, for example, the conductive lines 701, 702, through 732 on the substrate 800, and then a hard mask 832 and a buffer mask layer 834, are sequentially formed on the conductive layer 830 in the order stated. In addition, using methods described with reference to FIG. 3A, in the first region AA and the second conductive region BB, the dual mask layer 320 and the variable mask layer 330 are sequentially formed on the buffer mask layer 834 in the order stated.

Then, the photoresist patterns 340P2 are formed on the variable mask layer 330 by using a method described with reference to FIGS. 3B through 3F.

The photoresist patterns 340P2 includes the first mask portions 340A that are repeatedly formed at a first pitch 2PC on the memory cell region 700A and the connection region 700B, and the second mask portions 340B that are formed on the memory cell region 700A and the peripheral circuit region 700C. The first mask portions 340A may extend across the memory cell region 700A and the connection region 700B on the variable mask layer 330.

The first mask portions 340A may be formed at the first pitch 2PC that is twice as much as a pitch PC of a fine pattern to be finally formed on the memory cell region 700A and the connection region 700B. In addition, a fine width W3 of each of the first mask portions 340A formed on the memory cell region 700A and the connection region 700B so as to have a narrow width may be the same or greater than the width of a pattern to be formed on the substrate 800, such as the width W8 of each of the conductive lines 701, 702, through 732 of FIG. 6.

The second mask portion 340B formed on the memory cell region 700A and the peripheral circuit region 700C so as to have a wide width pattern may have a pattern smaller than a pattern to be finally formed on the second mask portion 340B. For example, when the ground selection line GSL of FIG. 6 is formed, the second mask portion 340B is formed so as to have a width W12 that is smaller than the width W10 of the ground selection line GSL that is finally to be formed, as illustrated in a cross-sectional view taken along the line 8C-8C' of FIG. 7B. In addition, when the peripheral circuit conductive pattern 772 of FIG. 6 is formed, the second mask portion 340B is formed so as to have a width W13 that is smaller than a width W11 of the peripheral circuit conductive pattern 772 that is finally to be formed, as illustrated in a cross-sectional view taken along the line 8D-8D' of FIG. 7B.

Some embodiments provide that the substrate 800 may be a semiconductor substrate such as a silicon substrate.

The conductive layer 830 may be formed of doped polysilicon, metal, metal nitride, and/or a combination thereof. For example, when a word line is formed from the conductive layer 830, the conductive layer 830 may include any one selected from the group consisting of TaN, TiN, W, WN, HfN, tungsten silicide and/or combinations thereof. Alternatively, when a bit line is formed from the conductive layer 830, the conductive layer 830 may be formed of doped polysilicon or metal.

The hard mask 832 may be formed as a single layer. In some embodiments, the hard mask 832 may have a multi-layered structure including two or more hard mask layers having different etch properties under a selected etching condition. For example, the hard mask 832 may be an oxide layer, a nitride layer, and/or a combination thereof. For example, the hard mask 832 may be formed of an oxide layer, and the buffer mask layer 834 may be a polysilicon layer and/or a nitride layer; however, the present invention is not limited thereto. The hard mask 832 and the buffer mask layer 834 may be formed of any material having different etch selectivities under a selected etching condition. If necessary, the buffer mask layer 834 may be omitted. The thickness of the hard mask 832 may be in a range of about 1000 to about 3000 Å. The thickness of the buffer mask layer 834 may be in a range of about 300 to about 1000 Å.

Figure 8A:
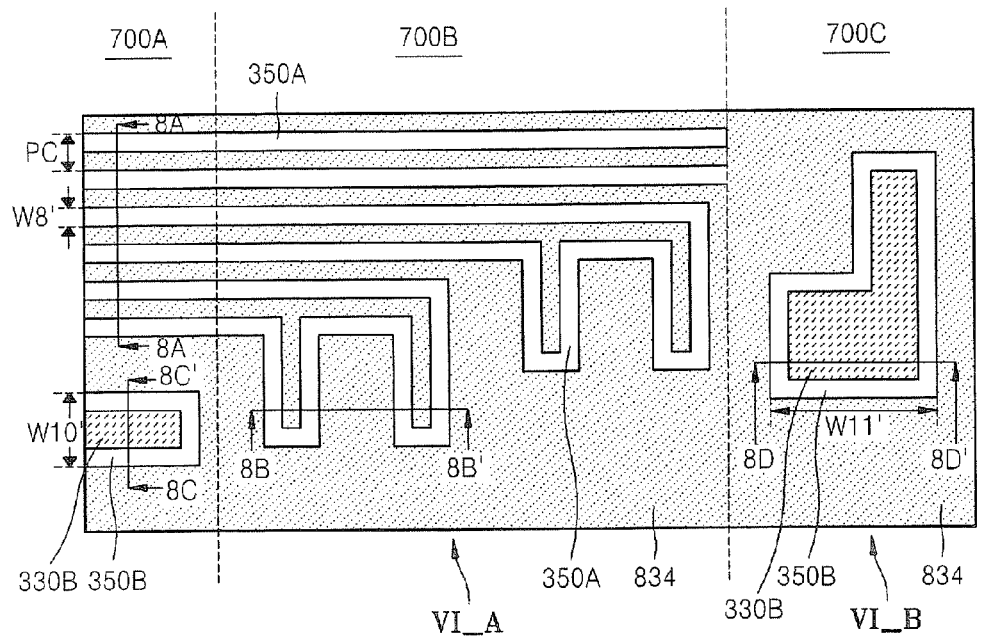
Figure 8B:
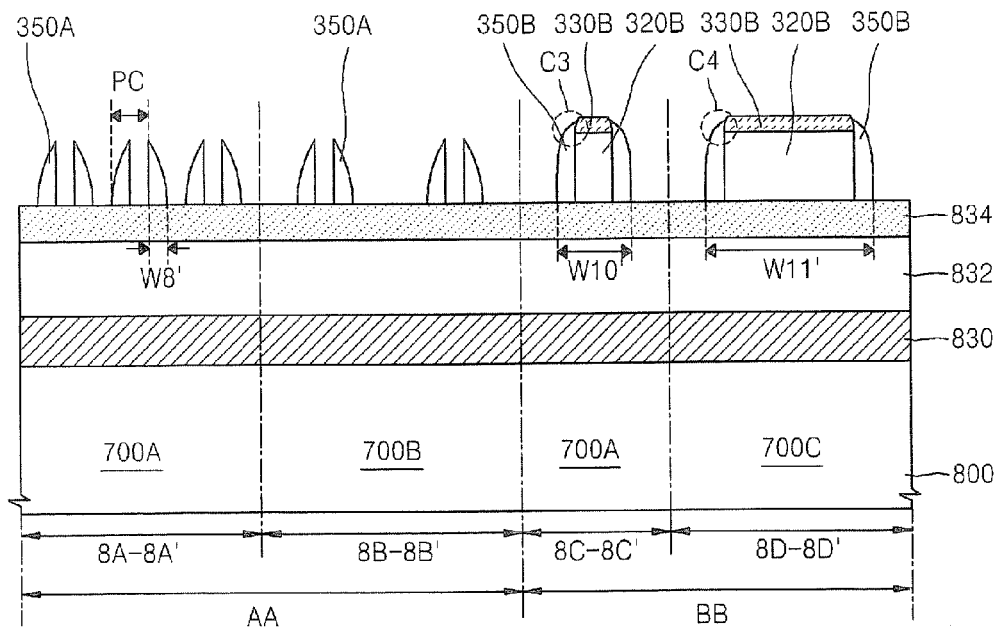

Referring to FIGS. 8A and 8B, using methods as described with reference to FIGS. 3G through 3J, in the memory cell region 700A and the connection region 700B, a plurality of first spacers 350A are formed on the buffer mask layer 834 in the first region AA where a narrow width pattern is formed. In addition, the second mask pattern 320B, the second variable mask pattern 330B covering an upper surface of the second mask pattern 320B, and the second spacers 350B respectively covering side walls of the second mask patterns 320B and the second variable mask patterns 330B are formed on the buffer mask layer 834 in the second conductive region BB where a wide width pattern is formed.

In the first region AA, the first spacers 350A may each have the same width W8' as the width W8 (refer to FIG. 6) of each of the conductive lines 701, 702, through 732, and may be repeatedly formed at the fine pitch PC that is ½ as much as the first pitch 2PC (refer to FIGS. 7A and 7B).

In the second conductive region BB, the side walls of the second mask patterns 320B are respectively covered by side walls of the second spacers 350B, and an upper surface of the second mask pattern 320B are covered by the second variable mask patterns 330B. As illustrated in the dashed circles "C3" and "C4" of FIG. 8B, upper portions of the side walls of the second spacers 350B contact with portions of the second variable mask patterns 330B, and thus the second mask patterns 320B are completely covered by the second spacers 350B and the second variable mask patterns 330B so that the second mask patterns 320B are not exposed in the second conductive region BB.

In the second conductive region BB, the sum (i.e., W10' or W11') of the width of the second mask pattern 320B and the width of the second spacers 350B covering side walls thereof may correspond to the width W10 of the ground selection line GSL and the width W11 of the peripheral circuit conductive pattern 772 of FIG. 6, respectively.

The first spacers 350A and the second spacers 350B of FIGS. 8A and 8B may each have a loop shape when viewed from above.

Figure 9A:
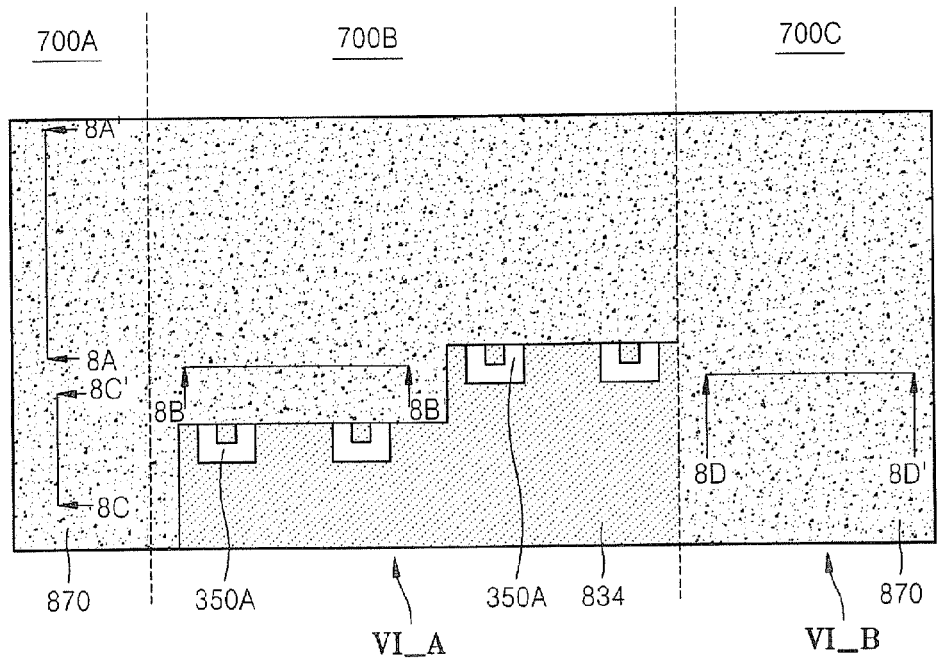
Figure 9B:
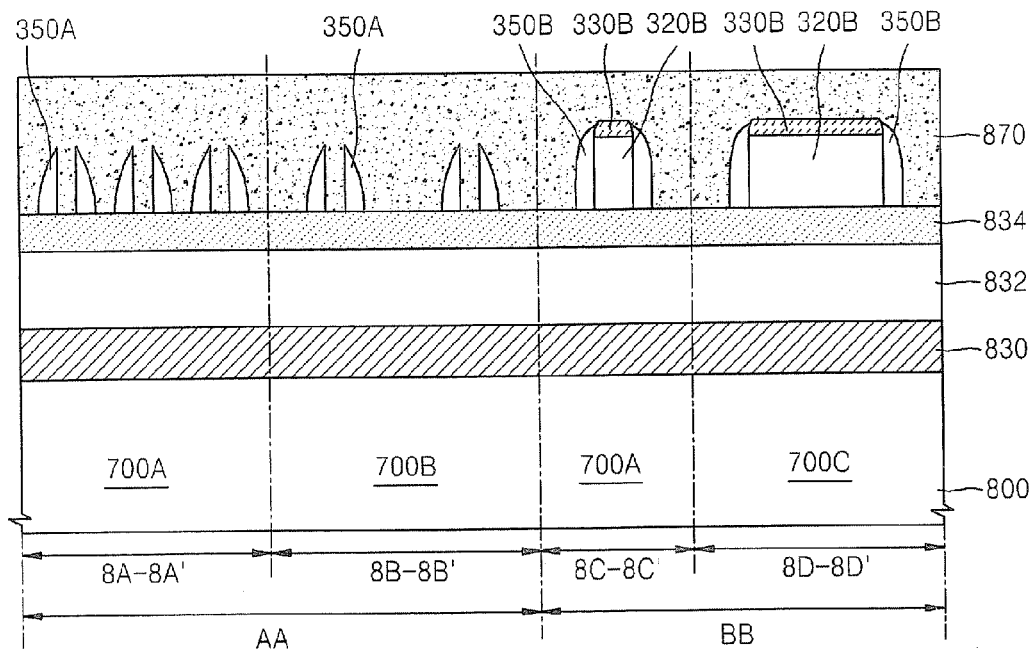

Referring to FIGS. 9A and 9B, a separation mask pattern 870 is formed on the first spacers 350A in the first region AA, the second mask pattern 320B, and the second spacers 350B and the second variable mask pattern 330B covering the second mask pattern 320B in the second conductive region BB.

After the separation mask pattern 870 is formed, some of the first spacers 350A and some of the buffer mask layer 834 formed below the first spacers 350A are exposed through the separation mask pattern 870 on the substrate 800 in the connection region 700B. Although not illustrated, some of the first spacers 350A and some of the buffer mask layer 834 formed below the first spacers 350A may also be exposed on the memory cell region 700A through the separation mask pattern 870 at an opposite side of the connection region 700B, that is, an end furthest from the connection region 700B from among right and left ends of the conductive lines 701, 702, through 732 of FIG. 6.

The separation mask pattern 870 may be a photoresist pattern.

Figure 10A:
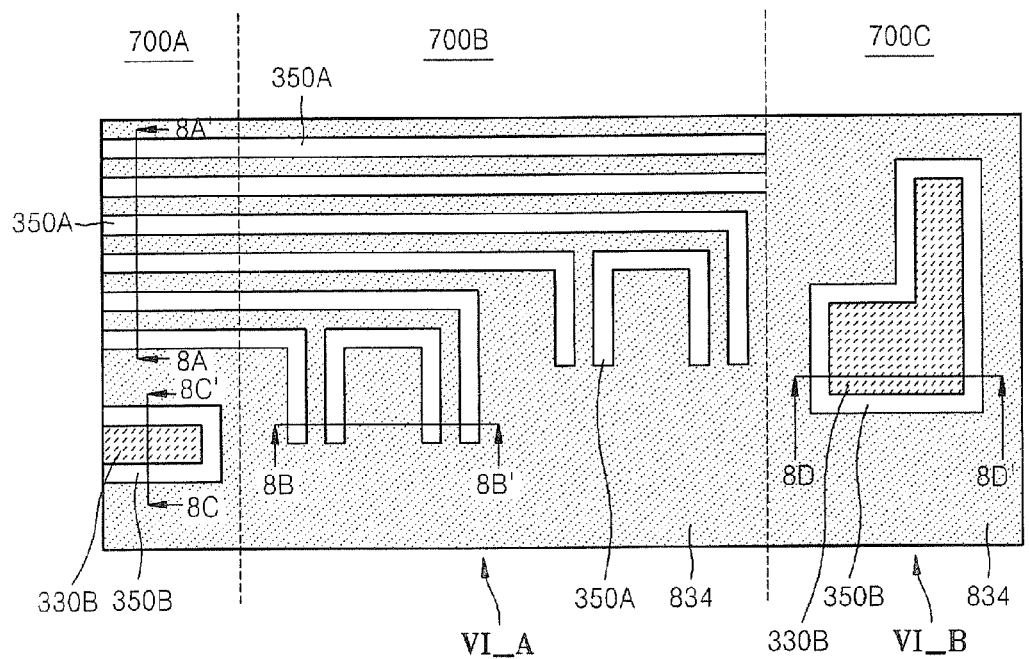
Figure 10B:
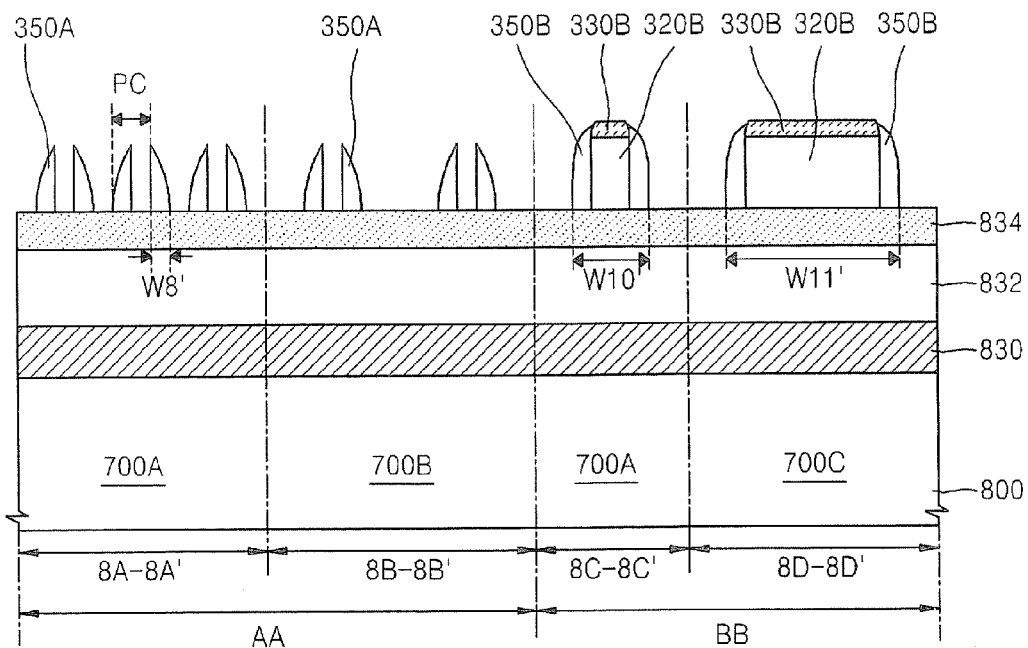

Referring to FIGS. 10A and 10B, a trimming process of removing exposed portions of the first spacers 350A is performed on the connection region 700B of the substrate 800 by using the separation mask pattern 870 as an etch mask. As a result, in the memory cell region 700A and the connection region 700B of the substrate 800, the first spacers 350A previously having a loop shape are divided into two parts. Then, the separation mask pattern 870 is removed.

Figure 11A:
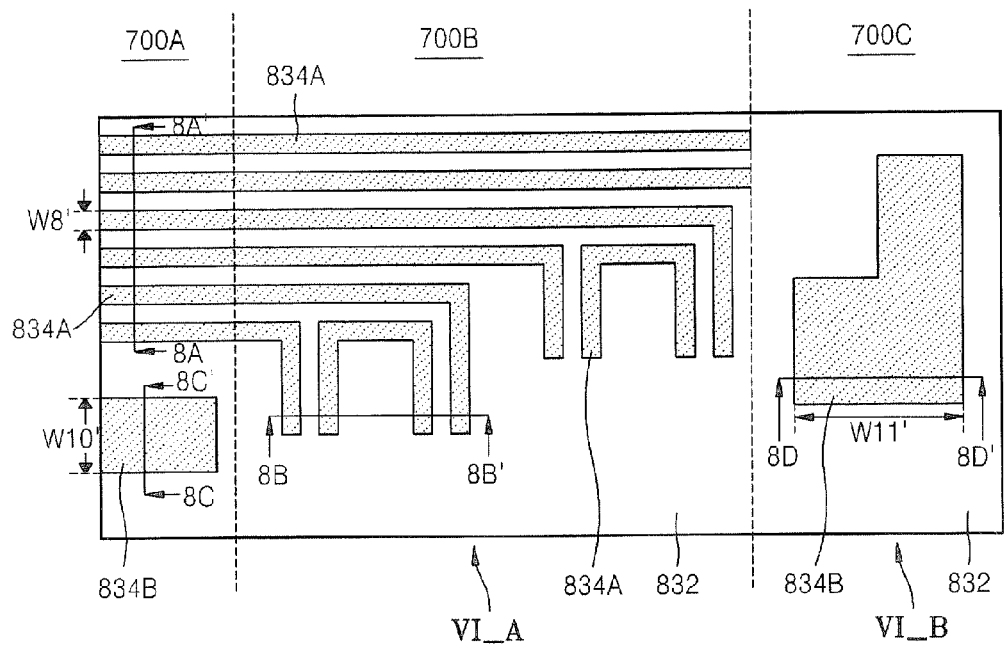
Figure 11B:
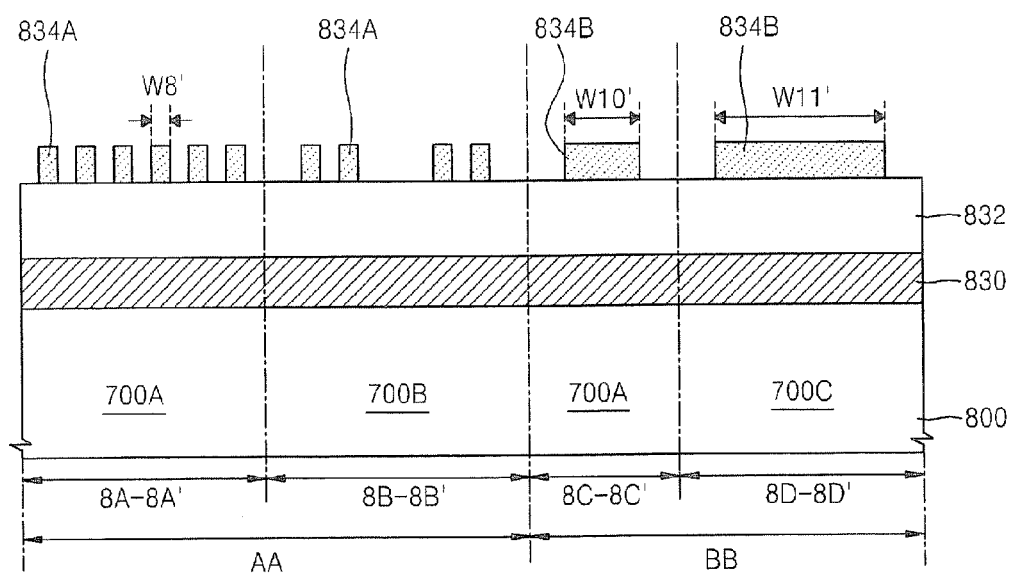

Referring to FIGS. 11A and 11B, a plurality of buffer mask patterns 834A and 834B are formed by etching the buffer mask layer 834 by using the first spacers 350A as an etch mask in the first region AA, and the second spacers 350B covering the side walls of the second mask patterns 320B as an etch mask in the second conductive region BB. The hard mask 832 is exposed through the buffer mask patterns 834A and 834B.

Although not illustrated, after the buffer mask patterns 834A and 834B are formed, a remaining layer of the first spacers 350A, and remaining layers of the second mask pattern 320B and the second spacers 350B may remain on the buffer mask patterns 834A and 834B.

Figure 12A:
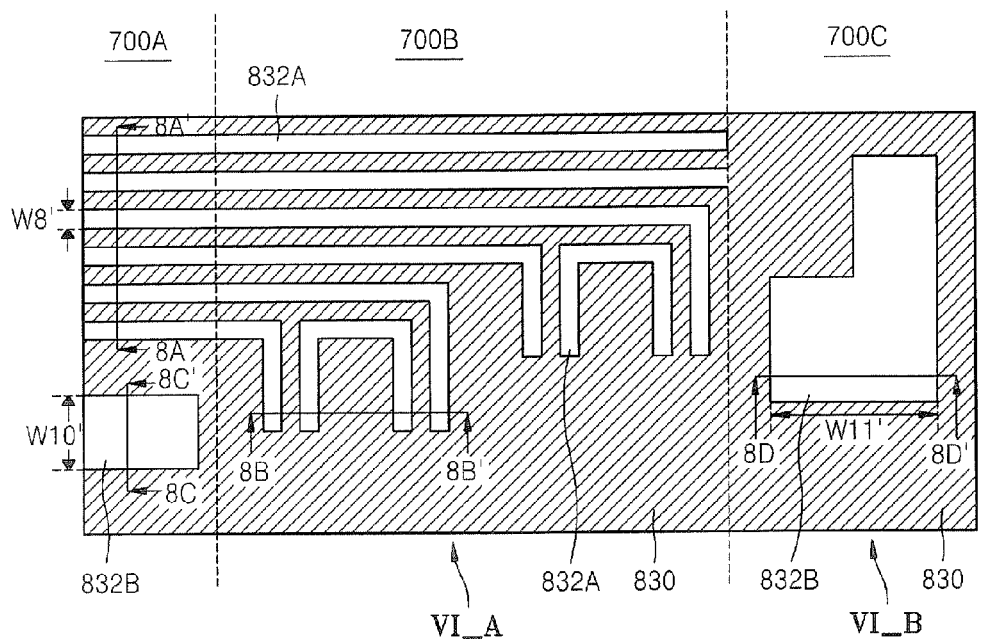
Figure 12B:
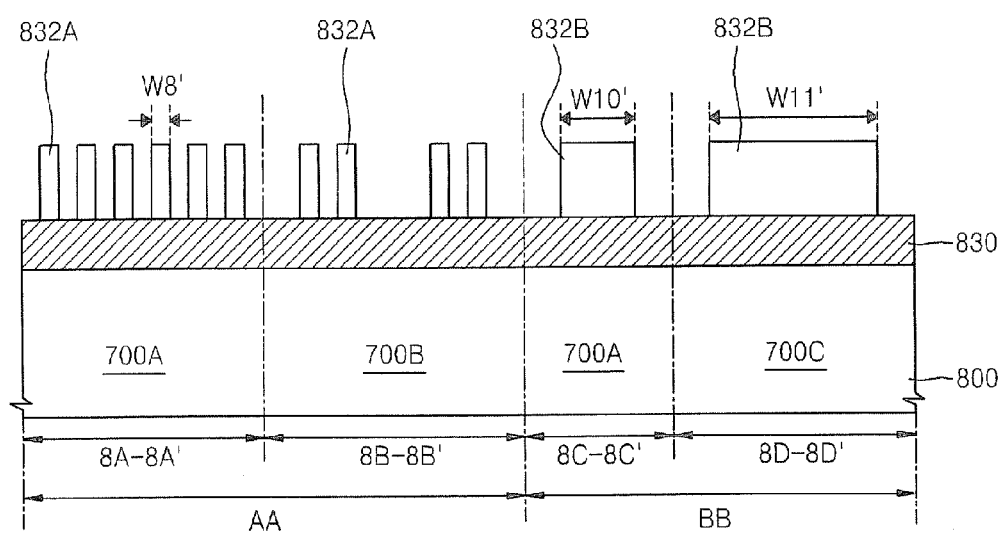

Referring to FIGS. 12A and 12B, a plurality of hard mask patterns 832A and 832B are formed in the first region AA and the second conductive region BB by etching the hard mask 832 by using the buffer mask patterns 834A and 834B as an etch mask. The conductive layer 830 is exposed through the hard mask patterns 832A and 832B.

Although not illustrated, after the hard mask patterns 832A and 832B are formed, remaining layers of the buffer mask patterns 834A and 834B may remain on the hard mask patterns 832A and 832B.

Figure 13A:
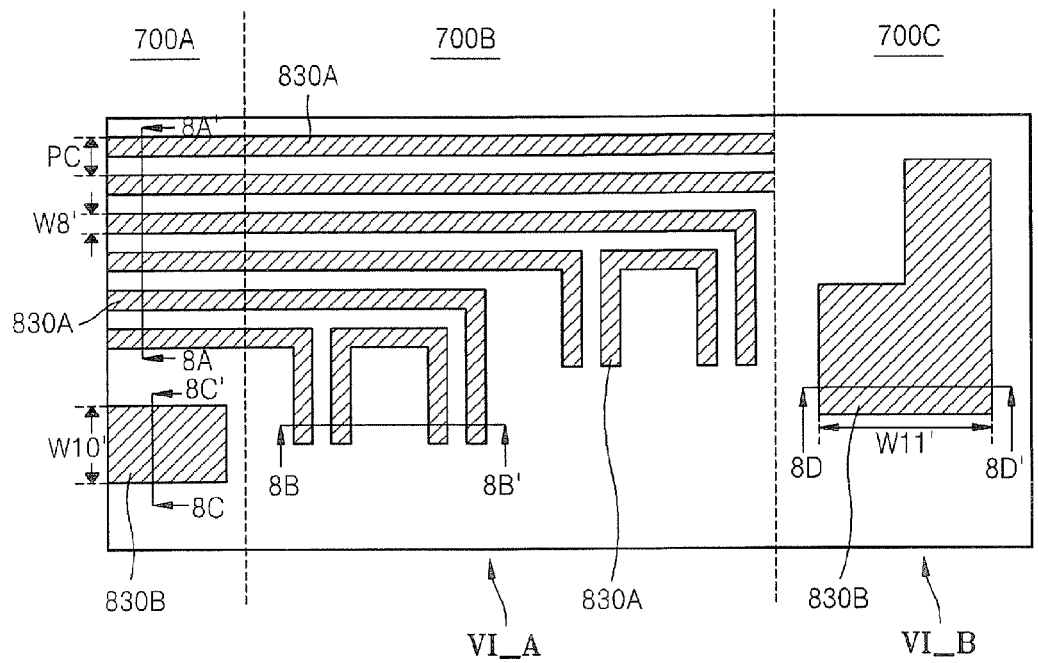
Figure 13B:
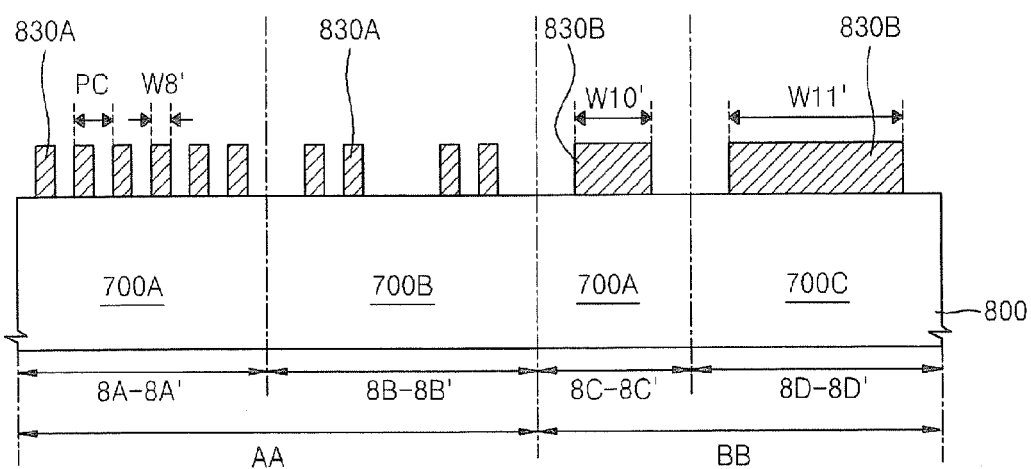

Referring to FIGS. 13A and 13B, the conductive layer 830 is etched using the hard mask patterns 832A and 832B as an etch mask in the first region AA and the second conductive region BB.

As a result, a plurality of first conductive patterns 830A are formed in the first region AA of the substrate 800, wherein the widths and pitch of first conductive patterns 830A are transferred from the first spacers 350A (refer to FIGS. 10A and 10B). In the second conductive region BB of the substrate 800, a plurality of second conductive patterns 830B are formed, wherein each of the second conductive patterns 830B has a width (i.e., W10' or W11') that is the sum of the width of the second mask pattern 320B and the width of the second spacers 350B covering side walls of the second mask pattern 320B.

Although not illustrated in FIGS. 13A and 13B, after the first conductive patterns 830A and the second conductive patterns 830B are formed, remaining layers of the hard mask patterns 832A and 832B may remain on the first conductive patterns 830A and the second conductive patterns 830B.

The first conductive patterns 830A formed in the first region AA may constitute the conductive lines 701, 702, through 732 and the dummy conductive lines 750 of FIG. 6. The first conductive patterns 830A may each have a first width W8' that is ¼ as much as the first pitch 2PC (refer to FIGS. 7A and 7B) on the memory cell region 700A. The first conductive patterns 830A may be repeatedly formed at the fine pitch PC that is ½ as much as the first pitch 2PC. In the memory cell region 700A and the peripheral circuit region 700C, the second conductive patterns 830B formed in the second conductive region BB may constitute the ground selection line GSL and the peripheral circuit conductive pattern 772 of FIG. 6. Although not illustrated in FIGS. 7A and 7B through 13A and 13B, in order to form the string selection line SSL of FIG. 6, a conductive pattern for forming the string selection line SSL may be formed using the same process as a method of forming the second conductive patterns 830B in the memory cell region 700A, as illustrated in FIGS. 15A and 15B.

According to methods of forming patterns of semiconductor devices as described with reference to FIGS. 7A and 7B through 13A and 13B, the first conductive patterns 830A may be formed in the first region AA having patterns that are relatively small on the substrate 800 so as to have relatively narrow-width patterns of which the pattern density is doubled using a double patterning process in which the first spacers 350A formed on side walls of the first mask pattern 320A are used as an etch mask. In addition, in the second conductive region BB having patterns that are wider than patterns of the first region AA, the second conductive patterns 830B having a relatively wide-width may be formed on the substrate 800 by using, as etch masks, the second mask patterns 320B that are simultaneously formed with the first mask pattern 320A, and the second spacers 350B that are simultaneously formed with the first spacers 350A. When patterns are simultaneously formed so as to respectively have different widths on the first region AA and the second conductive region BB, the photoresist patterns 340P2 (refer to FIGS. 7A and 7B) are formed, wherein each of the photoresist patterns 340P2 has a relatively-small thickness on the first region AA where the first conductive patterns 830A having a relatively narrow width are formed, and a relatively thick thickness on the second conductive region BB where the second conductive patterns 830B having a relatively wide width are formed. As a result, the first variable mask pattern 330A and the second variable mask pattern 330B are obtained, and a difference of the thickness between the first variable mask pattern 330A and the second variable mask pattern 330B is used. Thus, when a plurality of patterns are simultaneously formed on the first region AA and the second conductive region BB, since a separate photolithography process is not further performed, processes may be simplified, and manufacturing costs may be reduced.

In addition, by forming a plurality of conductive patterns on the substrate 800 as illustrated in FIGS. 5A through 5F, fine conductive patterns may be repeatedly formed on the first region AA of the substrate 800, for example, on the memory cell region 700A at a fine pitch that is about ½ as much as a pitch of a general photolithography process. Thus, it is easy to form a plurality of conductive patterns that have a fine width and are repeatedly formed at a fine pitch surpassing a resolution limit of the general photolithography process.

While the present invention has been particularly shown and described with reference to exemplary embodiments thereof, it will be understood that various changes in form and details may be made therein without departing from the spirit and scope of the following claims.

What is claimed is:

1. A method of forming patterns of a semiconductor device, the method comprising:

forming a dual mask layer on a substrate having a first region and a second region;

forming a variable mask layer on the dual mask layer in the first region and the second region;

forming a first photoresist pattern and a second photoresist pattern on the variable mask layer, wherein the first photoresist pattern has a first thickness and a first width in the first region, and the second photoresist pattern has a second thickness greater than the first thickness and a second width wider than the first width in the second region;

forming a first mask pattern and a first variable mask pattern in the first region, and a second mask pattern and a second variable mask pattern in the second region, by sequentially etching the variable mask layer and the dual mask layer by using, as etch masks, the first photoresist pattern and the second photoresist pattern, wherein the first mask pattern comprises a first portion of the dual mask layer, and the first variable mask pattern is a first remaining portion of the variable mask layer and has a first thickness, and wherein the second mask pattern comprises a second portion of the dual mask layer, and the second variable mask pattern is a second remaining portion of the variable mask layer and has a second thickness that is greater than the first thickness of the first variable mask pattern;

simultaneously forming first spacers covering side walls of the first mask pattern and second spacers covering side walls of the second mask pattern;

removing the first mask pattern; and simultaneously etching the substrate in the first region and the second region by using the first spacers as an etch mask in the first region, and the second mask pattern and the second spacers as an etch mask in the second region.

2. The method of claim of claim 1, wherein the simultaneously forming of the first spacers and the second spacers comprises:

forming a spacer mask layer covering exposed surfaces of the first mask pattern and first variable mask pattern, and exposed surfaces of the second mask pattern and second variable mask pattern; and forming the first spacers and second spacers comprising a remaining portion of the spacer mask layer by etching the spacer mask layer.

3. The method of claim 2, wherein the forming of the first spacers and the second spacers comprises etching the spacer mask layer until the first variable mask pattern is completely removed so that an upper surface of the first mask pattern is exposed.

4. The method of claim 3, wherein the removing of the first mask pattern is performed when the second variable mask pattern covers an upper surface of the second mask pattern.

5. The method of claim 1, wherein the forming of the first photoresist pattern and second photoresist pattern comprises:

forming a photoresist layer on the variable mask layer in the first region and the second region;

exposing a portion of the photoresist layer in the first region through a first photomask having a transmittance greater than 0%, and exposing a portion of the photoresist layer in the second region through a second photomask on which a light absorbing pattern having a transmittance of 0% is formed; and developing the photoresist layer.

6. The method of claim of claim 5, wherein the first photomask and the second photomask are connected to each other to constitute a single photomask.

7. The method of claim 1, wherein the forming of the first photoresist pattern and second photoresist pattern comprises:

forming a photoresist layer on the variable mask layer in the first region and the second region;

forming a photoresist pattern of which the thickness in the first region is smaller than in the second region by exposing only a portion of the photoresist layer in the first region and then developing the exposed portion of the photoresist layer; and forming the first photoresist pattern and the second photoresist pattern by patterning the photoresist pattern.

8. The method of claim 1, wherein the forming of the first photoresist pattern and the second photoresist pattern comprises:

forming a photoresist layer on the variable mask layer in the first region and the second region;

forming a plurality of photoresist patterns having the same thickness in the first region and the second region by patterning the photoresist layer; and reducing a thickness of each of the photoresist patterns in the first region from among the plurality of photoresist patterns by exposing only a portion of the plurality of photoresist patterns in the first region and then developing the exposed portion of the plurality of photoresist patterns.

9. The method of claim 1, wherein the etching of the substrate comprises forming an isolation trench in the first region and second region.

10. The method of claim 1, wherein the substrate comprises an etched layer, wherein the dual mask layer is formed on the etched layer, and wherein the etching of the substrate comprises etching the etched layer.

* * * * *